US012799810B2

(12) United States Patent
Moores et al.

(10) Patent No.: US 12,799,810 B2
(45) Date of Patent: Nov. 17, 2026

(54) RADIO FREQUENCY (RF) SHIELDING AND ACOUSTIC INSULATION DOOR

(71) Applicant: Lockmasters, Inc., Nicholasville, KY (US)

(72) Inventors: Kevin A. Moores, Nicholasville, KY (US); Joseph P. McCormack, Nicholasville, KY (US); Brian K. Lamb, Nicholasville, KY (US)

(73) Assignee: Lockmasters, Inc., Nicholasville, KY (US)

( * ) Notice: Subject to any disclaimer, the term of this patent is extended or adjusted under 35 U.S.C. 154(b) by 0 days.

(21) Appl. No.: 19/548,537

(22) Filed: Feb. 24, 2026

(65) Prior Publication Data

US 2026/0251010 A1 Aug. 27, 2026

Related U.S. Application Data

(60) Provisional application No. 63/762,455, filed on Feb. 24, 2025.

(51) Int. Cl.

| | |
|---|---|
| ***E06B 7/28*** | (2006.01) |
| ***E06B 5/20*** | (2006.01) |
| ***H05K 9/00*** | (2006.01) |

(52) U.S. Cl.
CPC .................. *E06B 7/28* (2013.01); *E06B 5/20* (2013.01); *H05K 9/0001* (2013.01)

(58) Field of Classification Search
CPC . E06B 7/2314; E06B 7/28; E06B 5/18; E06B 5/20; H05K 9/0001
See application file for complete search history.

(56) References Cited

U.S. PATENT DOCUMENTS

| | | | | |
|---|---|---|---|---|
| 5,013,869 A * | 5/1991 | Breithaupt | ................ | E06B 5/18 174/368 |
| 5,569,878 A * | 10/1996 | Zielinski | .............. | H05K 9/0001 49/303 |
| 6,519,899 B1 * | 2/2003 | Hurzeler | ............. | H05K 9/0001 49/504 |

(Continued)

FOREIGN PATENT DOCUMENTS

| | | | | |
|---|---|---|---|---|
| FR | 2583099 A1 * | 12/1986 | ............... | E06B 5/18 |
| WO | WO-0055462 A1 * | 9/2000 | ............... | E06B 1/52 |

*Primary Examiner* — Christine T Cajilig
(74) *Attorney, Agent, or Firm* — Wood Herron & Evans LLP

(57) ABSTRACT

A door assembly includes a door and a frame. The door includes a body portion and a first RF shielding material disposed along a peripheral edge region of a side of the body portion. The frame is hingedly connected to the door and defines an opening sized to receive the door. The frame includes a cover portion, a jamb portion, a second RF shielding material positioned between the cover portion and the jamb portion, and a third RF shielding material disposed within the jamb portion. The third RF shielding material is conductively coupled to the second RF shielding material such that, when the body portion of the door is closed against the frame, the first RF shielding material, the second RF shielding material, and the third RF shielding material conductively engage and together form at least part of a continuous RF-shielding boundary around a periphery of the door assembly.

18 Claims, 15 Drawing Sheets

(56) References Cited

U.S. PATENT DOCUMENTS

| | | | | |
|---|---|---|---|---|
| 7,117,640 | B2 * | 10/2006 | Hurzeler | E06B 5/20<br>49/501 |
| 11,499,366 | B1 * | 11/2022 | Palmer | E06B 1/70 |
| 11,767,707 | B2 * | 9/2023 | Warnock | E06B 5/18<br>49/307 |
| 12,331,586 | B2 * | 6/2025 | Glover | H05K 9/0016 |
| 2015/0152679 | A1 * | 6/2015 | Kolobayev | E06B 5/18<br>49/305 |
| 2024/0130095 | A1 * | 4/2024 | Starr | E06B 5/18 |
| 2024/0352786 | A1 * | 10/2024 | Starr | E06B 5/10 |

* cited by examiner

RADIO FREQUENCY (RF) SHIELDING AND ACOUSTIC INSULATION DOOR

RELATED APPLICATION

The present application claims priority to U.S. Provisional Application Ser. No. 63/762,455, filed Feb. 24, 2025, the disclosure of which is hereby incorporated herein by reference in its entirety.

TECHNICAL FIELD

The present invention relates to a door adapted to provide radio frequency (RF) shielding and acoustic insulation.

BACKGROUND

Electromagnetic interference (EMI), or radio-frequency interference (RFI) when in the context of the radio frequency (RF) spectrum, refers to a disturbance generated by an external source that affects an electrical circuit by electromagnetic induction, electrostatic coupling, or conduction. RFI can disrupt the normal functions of an electronic device or network.

Doors that provide RF shielding are critical for environments that require protection from RFI. These environments include government facilities that store sensitive information, data centers, laboratories, communication rooms, music rooms, and/or the like. The primary purpose of a RF shielding door is to create a barrier that prevents the penetration or escape of RF signals, thereby maintaining the integrity and security of the protected space. In some situations, RF doors also require soundproofing or acoustic insulation to prevent or reduce the transmission of sound.

Conventional RF doors are typically heavy and constructed with traditional materials (such as copper and stainless steel) that require extensive manual effort to install, to perform maintenance on, and to use as an access point into an RF shielded room. Doors that are painted, or that include materials that are not applied with adhesive, may not provide optimal durability or resistance to wear and tear or cleaning, leading to maintenance issues over time. The weight and design of doors that are made of stainless steel or that have copper added to their construction can also contribute to an inefficient use of space and increased energy consumption, as well as pose challenges in terms of installation and handling. Over time, the painted surfaces may degrade, thereby interfering with the door's RF shielding properties.

Furthermore, some doors, often referred to as sound transmission class or "STC" doors, are designed to provide acoustic insulation. These doors must satisfy sound transmission class radio frequency (STCRF) requirements that emphasize acoustic insulation and reducing sound transmission through dense, rigid, and heavy materials like steel and a proprietary core of the door. The STCRF requirements typically involve measuring attenuation of EMI and RFI, and are often specified in decibels (dB) across a range of frequencies (e.g., 10 kilohertz (kHz) to 18 gigahertz (GHz)). Performance can range from 60 dB to 100 dB attenuation, depending on the application. The STC requirements typically involve measuring sound insulation capability. This can range from STC 30-55 depending on the application. Higher values mean better soundproofing which is critical for noise-sensitive environments. STCRF requirements may further include application-specific requirements, construction and material requirements, and compliance and testing standard requirements.

However, the STC design prioritizes sound isolation, with no inherent consideration of RFI. Comparatively, a design for an RF shielding door involves using RF shielding material and is typically applied to lightweight, flexible structures or fabrics. The design for the RF shielding door requires proper electrical continuity and grounding which is not a consideration in traditional STC door construction.

Thus, there is a need for a lighter, more efficient design of an RF door that eases installation and eliminates the drawbacks of weight, paint degradation, and maintenance issues, while maintaining optimal shielding and performance characteristics. There is also a need for an RF door design that satisfies all applicable STCRF requirements without sacrificing the above-identified benefits.

SUMMARY

In an aspect of the invention, a door assembly adapted to provide radio frequency (RF) shielding and acoustic insulation is provided. The door assembly includes a door and a frame. The door includes a body portion and a first RF shielding material disposed along a peripheral edge region of a side of the body portion. The frame is hingedly connected to the door and defines an opening sized to receive the door. The frame includes a cover portion and a jamb portion. The frame further includes a second RF shielding material positioned between the cover portion and the jamb portion and a third RF shielding material disposed within the jamb portion. The third RF shielding material is conductively coupled to the second RF shielding material such that, when the body portion of the door is closed against the frame, the first RF shielding material, the second RF shielding material, and the third RF shielding material conductively engage and together form at least part of a continuous RF-shielding boundary around and across a periphery of the door assembly.

In an embodiment of the invention, the frame further includes a fourth RF shielding material disposed within one or more internal cavities of the cover portion of the frame.

In another embodiment of the invention, the first RF shielding material extends at least partially from the peripheral edge region of the side of the body portion to an adjacent side surface.

In another embodiment of the invention, the first RF shielding material extends at least partially into one or more hinge slots each respectively sized to receive a hinge assembly.

In another embodiment of the invention, the second RF shielding material extends continuously along at least three sides of the frame to provide an unbroken conductive path under the cover portion.

In another embodiment of the invention, the third RF shielding material extends continuously along a jamb head piece and opposing jamb side pieces of the jamb portion of the frame.

In another embodiment of the invention, the door assembly further includes a conductive threshold disposed along a bottom portion of the frame. The conductive threshold is configured to conductively engage the first RF shielding material when the door is closed against the frame such that the conductive threshold forms part of the continuous RF-shielding boundary.

In another embodiment of the invention, the door has a core including one or more sound-attenuating materials selected from mineral wool, fiberglass, foam, mass-loaded vinyl, a gypsum board, a lead sheet, or a high-density particle board.

In another aspect of the invention, a door assembly adapted to provide radio frequency (RF) shielding and acoustic insulation is provided. The door assembly includes a door and a frame. The door includes a body portion and a first RF shielding material disposed along a peripheral edge region of a side of the body portion. The frame is hingedly connected to the door and defines an opening sized to receive the door. The frame includes a cover portion and a jamb portion. The frame further includes a second RF shielding material positioned between the cover portion and the jamb portion and a further RF shielding material disposed within one or more internal cavities of the cover portion of the frame. The further RF shielding material is conductively coupled to the cover portion and to the second RF shielding material such that, when the body portion of the door is closed against the frame, the first RF shielding material and the second RF shielding material conductively engage to define at least part of a continuous RF-shielding boundary around and across a periphery of the opening defined by the frame, and where the further RF shielding material electrically participates in the RF-shielding boundary.

In an embodiment of the invention, the further RF shielding material is a fourth RF shielding material. In this embodiment, the frame further includes a third RF shielding material disposed within the jamb portion, where the third RF shielding material is conductively coupled to the second RF shielding material such that, when the body portion of the door is closed against the frame, the first RF shielding material, the second RF shielding material, and the third RF shielding material conductively engage and together form at least part of the continuous RF-shielding boundary around the periphery of the door assembly. In another embodiment of the invention, the third RF shielding material extends continuously along a jamb head piece and opposing jamb side pieces of the jamb portion of the frame.

In another embodiment of the invention, the first RF shielding material extends at least partially from the peripheral edge region of the side of the body portion to an adjacent side surface.

In another embodiment of the invention, the first RF shielding material extends at least partially into one or more hinge slots each respectively sized to receive a hinge assembly.

In another embodiment of the invention, the second RF shielding material extends continuously along at least three sides of the frame to provide an unbroken conductive path under the cover portion.

In another embodiment of the invention, the door assembly further includes a conductive threshold disposed along a bottom portion of the frame. The conductive threshold is configured to conductively engage the first RF shielding material when the door is closed against the frame such that the conductive threshold forms part of the continuous RF-shielding boundary.

In another aspect of the invention, door assembly adapted to provide radio frequency (RF) shielding and acoustic insulation is provided. The door assembly includes a door and a frame. The door includes a body portion and a first RF shielding material disposed along a peripheral edge region of a side of the body portion. The frame is hingedly connected to the door and defines an opening sized to receive the door. The frame includes a cover portion and a jamb portion. The frame further includes a second RF shielding material positioned between the cover portion and the jamb portion, a third RF shielding material disposed within the jamb portion, and a fourth RF shielding material disposed within one or more internal cavities of the cover portion of the frame. The third RF shielding material is conductively coupled to the second RF shielding material such that, when the body portion of the door is closed against the frame, the first RF shielding material, the second RF shielding material, and the third RF shielding material conductively engage and together form at least part of a continuous RF-shielding boundary around and across a periphery of the door assembly, and where the fourth RF shielding material electrically participates in the RF-shielding boundary.

In an embodiment of the invention, the first RF shielding material extends at least partially from the peripheral edge region of the side of the body portion to an adjacent side surface.

In another embodiment of the invention, the first RF shielding material extends at least partially into one or more hinge slots each respectively sized to receive a hinge assembly.

In another embodiment of the invention, the second RF shielding material extends continuously along at least three sides of the frame to provide an unbroken conductive path under the cover portion, and the third RF shielding material extends continuously along a jamb head piece and opposing jamb side pieces of the jamb portion of the frame.

In another embodiment of the invention, the door assembly further includes a conductive threshold disposed along a bottom portion of the frame. The conductive threshold is configured to conductively engage the first RF shielding material when the door is closed against the frame such that the conductive threshold forms part of the continuous RF-shielding boundary.

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION

Some embodiments described herein include a door assembly adapted to provide RF shielding and/or acoustic insulation. The door assembly includes a door and a frame hingedly connected to the door. The door includes a body portion, a panel portion, and a first RF shielding material disposed along peripheral edge regions of an interior side face of the body portion of the door. The frame is hingedly connected to the door and defines an opening sized to receive the door. The frame includes a cover portion, a jamb portion, a second RF shielding material positioned between the cover portion and the jamb portion, and/or a third RF shielding material disposed within the jamb portion. The third RF shielding material is positioned to establish electrical continuity between the second RF shielding material and an RF-shielded structure surrounding the frame (e.g., a wall of a room receiving RF shielding). When the body portion of the door is closed against the frame, the first, second, and third RF shielding materials electromechanically engage to form at least part of a continuous RF-shielding path around a periphery of the door assembly. This creates a complete RF barrier around the RF-shielded enclosure. Example embodiments of the door assembly are shown in FIGS. 1-15 and described below.

Figure 1:
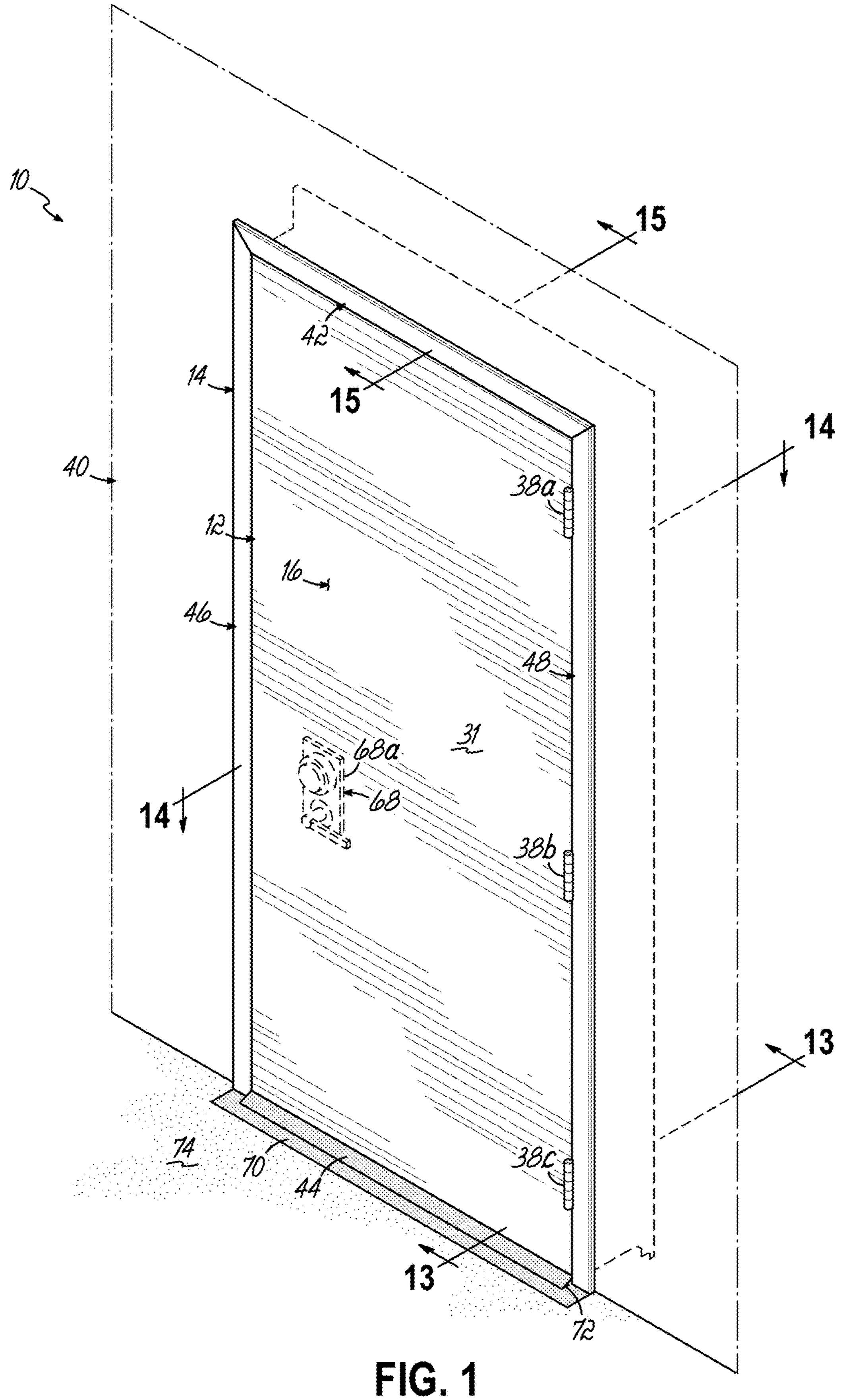
FIG. 1 shows a perspective view of an exterior side of a door that is part of a door assembly that provides radio frequency (RF) shielding and acoustic insulation according to the principles of the present disclosure.
Figure 2:
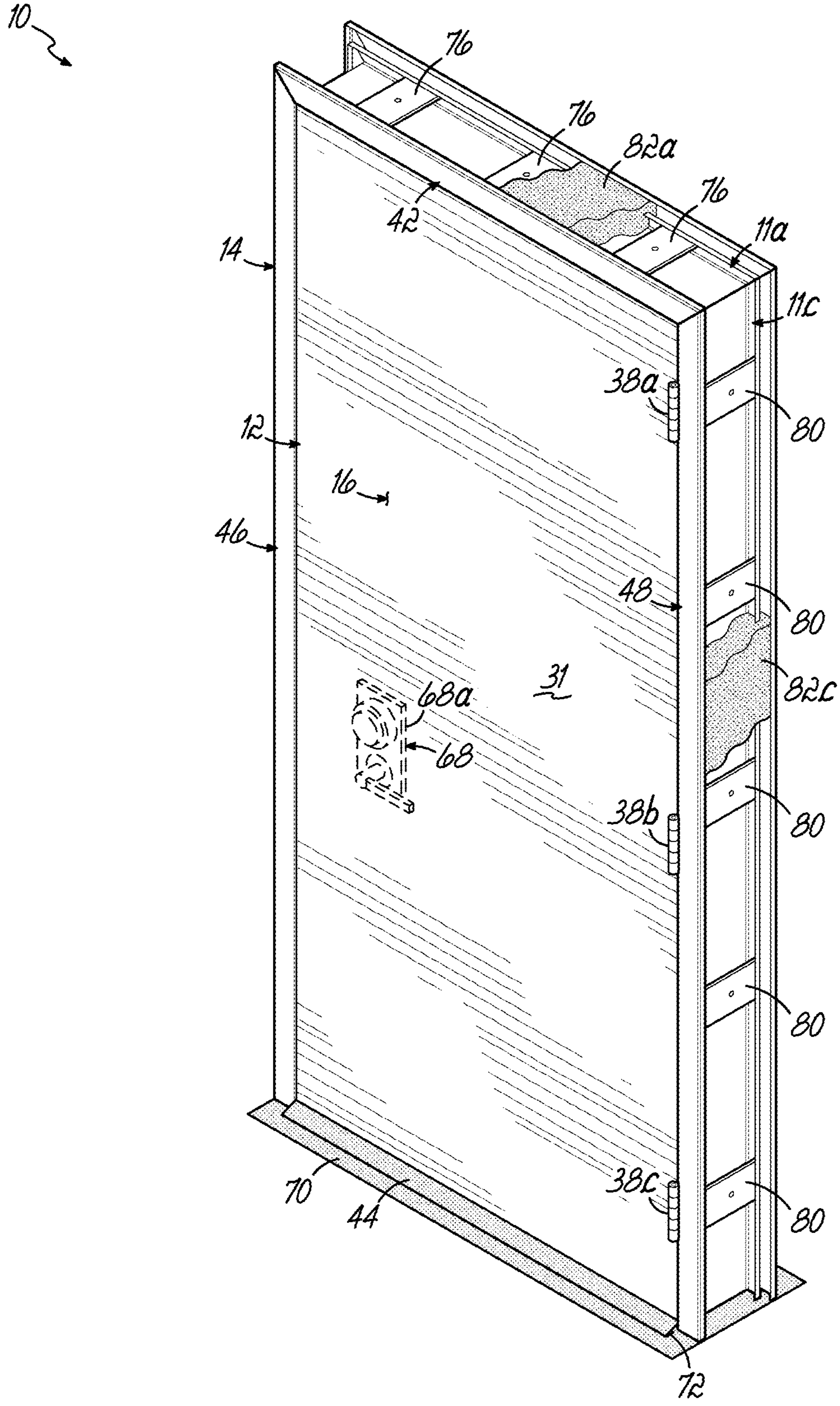
FIG. 2 shows a perspective view of the exterior side of the door assembly, where the door assembly further includes a frame.

FIGS. 1 and 2 show perspective views of an exterior side of a door assembly 10 that provides RF shielding and/or acoustic insulation. As used herein, the term "exterior side" refers to a side of the door assembly 10 that is external to an RF-shielded enclosure, while the term "interior side" refers to a side of the door assembly 10 that is internal to the RF-shielded enclosure. The door assembly 10 may provide RF shielding and/or acoustic insulation for an RF-shielded enclosure in which a neighboring wall 40 is lined, backed, or otherwise integrated with an RF shielding material such as an RF shielding fabric or foil. The RF shielding material may be disposed on one or both sides of the wall 40 and may extend continuously across adjoining structural surfaces, such as ceilings, floors, adjacent walls, to form a substantially continuous Faraday-cage-type envelope surrounding the enclosed space.

The door assembly 10 includes a door 12 and a frame 14 mounted within the wall 40. FIG. 1 shows an exterior side 31 of the body portion 16 of the door 12, where the exterior side 31 represents a portion of the door 12 that is on the outside of the RF-shielded structure when the door 12 is in a closed position. The interior side 32 (see, e.g., FIG. 3) represents a portion of the door 12 that is within the RF-shielded structure when the door 12 is in the closed position. Sides of the frame 14 may also be referred to in a similar manner (e.g., an interior side, an exterior side, etc.).

The door 12 is operable between an open position and a closed position relative to the frame 14. For example, the frame 14 may be hingedly connected to the door 12 via one or more hinge assemblies. In some embodiments, as is shown in FIG. 1, the frame 14 may be hingedly connected to the door 12 via hinge assemblies 38*a*, 38*b*, 38*c*. In other embodiments, fewer hinge assemblies, or more hinge assemblies, may be used, depending on the size, weight, and/or performance requirements of the door 12.

Figure 4:
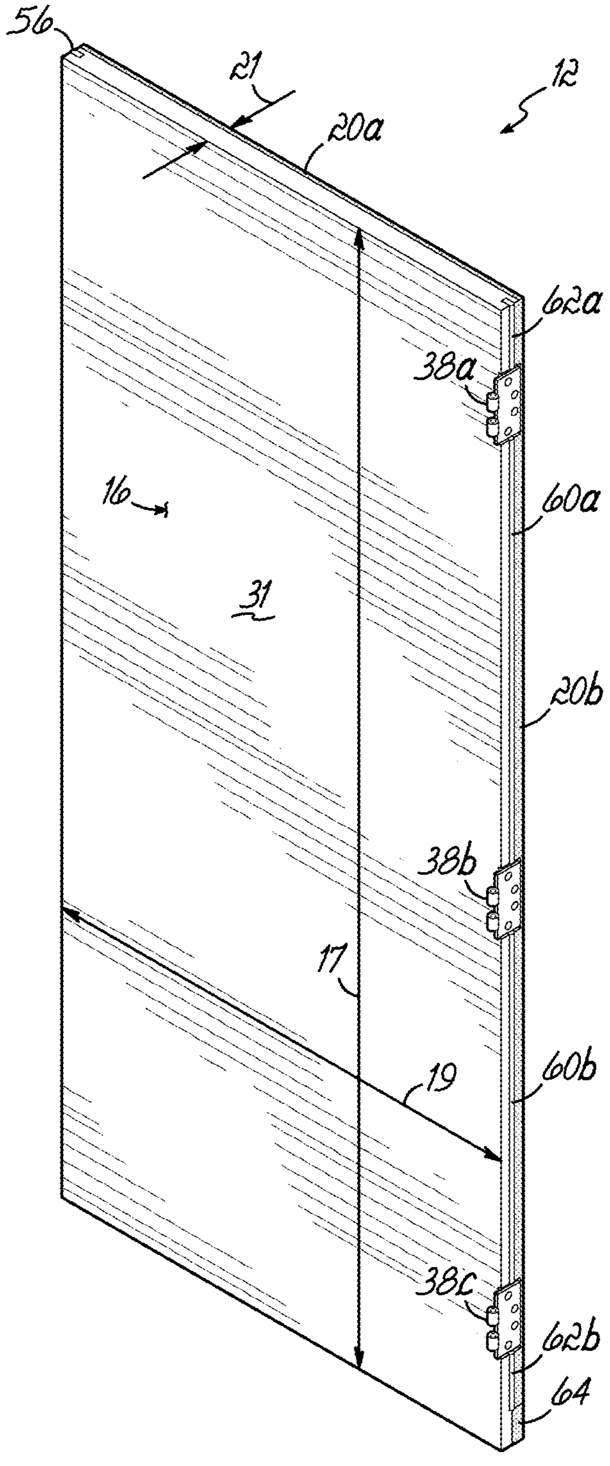
FIG. 4 shows a perspective view of the exterior side of the door.
Figure 5:
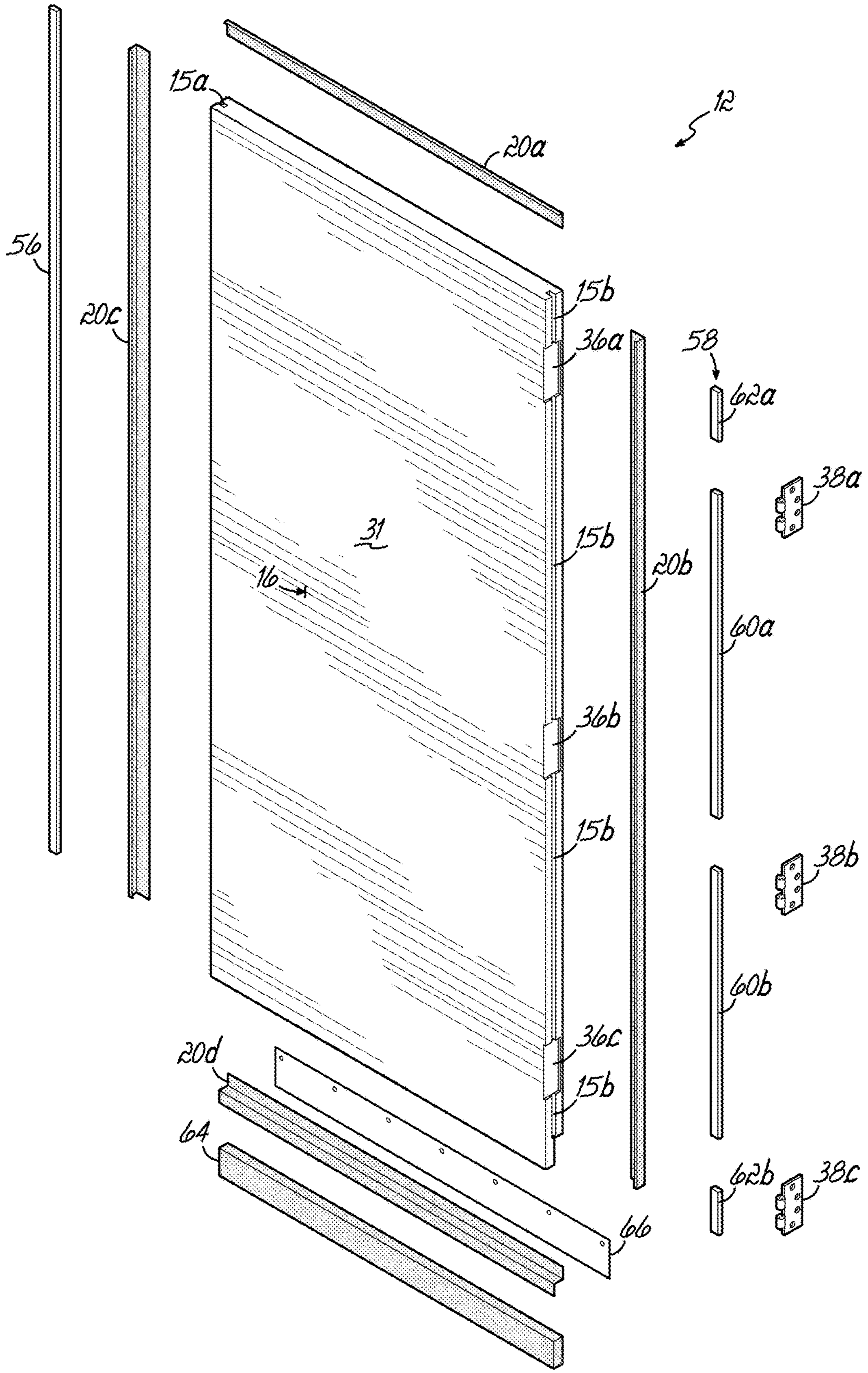
FIG. 5 is an exploded perspective view of the exterior side of the door, including a body portion, a first RF shielding material, and a panel portion.

As best shown in FIG. 4, hinge assemblies 38*a*, 38*b*, 38*c* may each have a hinge leaf that is mounted to a hinge side edge of the body portion 16 of the door 12. Each hinge leaf includes knuckles that are configured to receive a hinge pin, such as the hinge pin shown in FIG. 1. Each hinge assembly 38*a*, 38*b*, 38*c* enables pivotal movement of the door 12 between the open position and the closed position. The hinge leaves attached to the door 12 may be seated within corresponding hinge slots 36*a*, 36*b*, 36*c*, as is shown in FIG. 5. Each hinge slot 36*a*, 36*b*, 36*c* may be formed as a pocket or cutout configured to receive at least a portion of the hinge leaf such that the hinge leaf is recessed relative to an exterior surface of the door 12.

A handle assembly 68 may be mounted on the body portion 16 to facilitate manual opening and closing of the door 12. Handle assembly 68 may include a first side 68*a* (see, e.g., FIG. 1) and a second side 68*b* (see, e.g., FIG. 3). In some embodiments, the handle assembly 68 may include one or more exterior and/or interior actuation members, such as a lever handle, push bar, or panic bar, operatively coupled to a latch or locking mechanism housed within the body portion 16 of the door 12. In some embodiments, the handle assembly 68 may further include a lock cylinder, thumb turn, keypad, or other access-control device configured to selectively enable or disable door operation. In some embodiments, the handle assembly 68 may include a surface-mounted latch mechanism that engages a corresponding strike plate on the frame 14 when the door 12 is in a closed position. The components of the handle assembly 68 may be mounted on the exterior side 31, the interior side 32, or both sides of the door 12, and may be interconnected by internal linkage components extending through the body portion 16. The handle assembly 68 may be purely mechanical or may incorporate electromechanical components for access control, monitoring, or alarm integration, and may be configured to operate independently of, or in coordination with, the RF-shielding features of the door assembly 10, such that the latching mechanism ensures proper compression of the door 12 for optimal RF shielding and noise insulation.

Referring now to FIGS. 4-7, the door 12 may include a body portion 16, a panel portion, and a first RF shielding material shown as discrete pieces 20*a*, 20*b*, 20*c*, 20*d*. The body portion 16 forms a primary door slab or core. In some embodiments, the body portion 16 may include a single primary door slab or core. In other embodiments, the body portion 16 may include two primary door slabs or cores so as to form a double door.

In some embodiments, the body portion 16 of the door 12 provides RF shielding by including one or more conductive layers or cores (e.g., steel, lead, conductive sheet, or metallized composite layers) capable of attenuating RF energy across the main surface area of the door 12. As is best shown in FIG. 6, the one or more conductive layers or cores may be electrically coupled, directly, or indirectly, to the first RF shielding material 20*a*, 20*b*, 20*c*, 20*d* at peripheral edge region 30 so as to participate in the continuous RF-shielding boundary when the door 12 is closed against the frame 14.

In some embodiments, the body portion 16 may include an acoustically insulated core such that the door 12 provides acoustic insulation satisfying one or more sound transmission class (STC) requirements. The acoustically insulated core may include one or more sound-attenuating layers selected from mineral wool, fiberglass, foam, mass-loaded vinyl, gypsum board, lead sheet, high-density particle board, or combinations thereof, optionally arranged in a multi-layer composite structure with metallic or composite face sheets. Such constructions are configured to attenuate airborne sound transmission through the door 12, while peripheral sealing components of the panel portion (e.g., edge seal 56, edge seal assembly 58, threshold seal 64, door felt 88, drip flange 90, etc.) cooperate to limit sound leakage at edges and interfaces when the door 12 is in the closed position.

Figure 6:
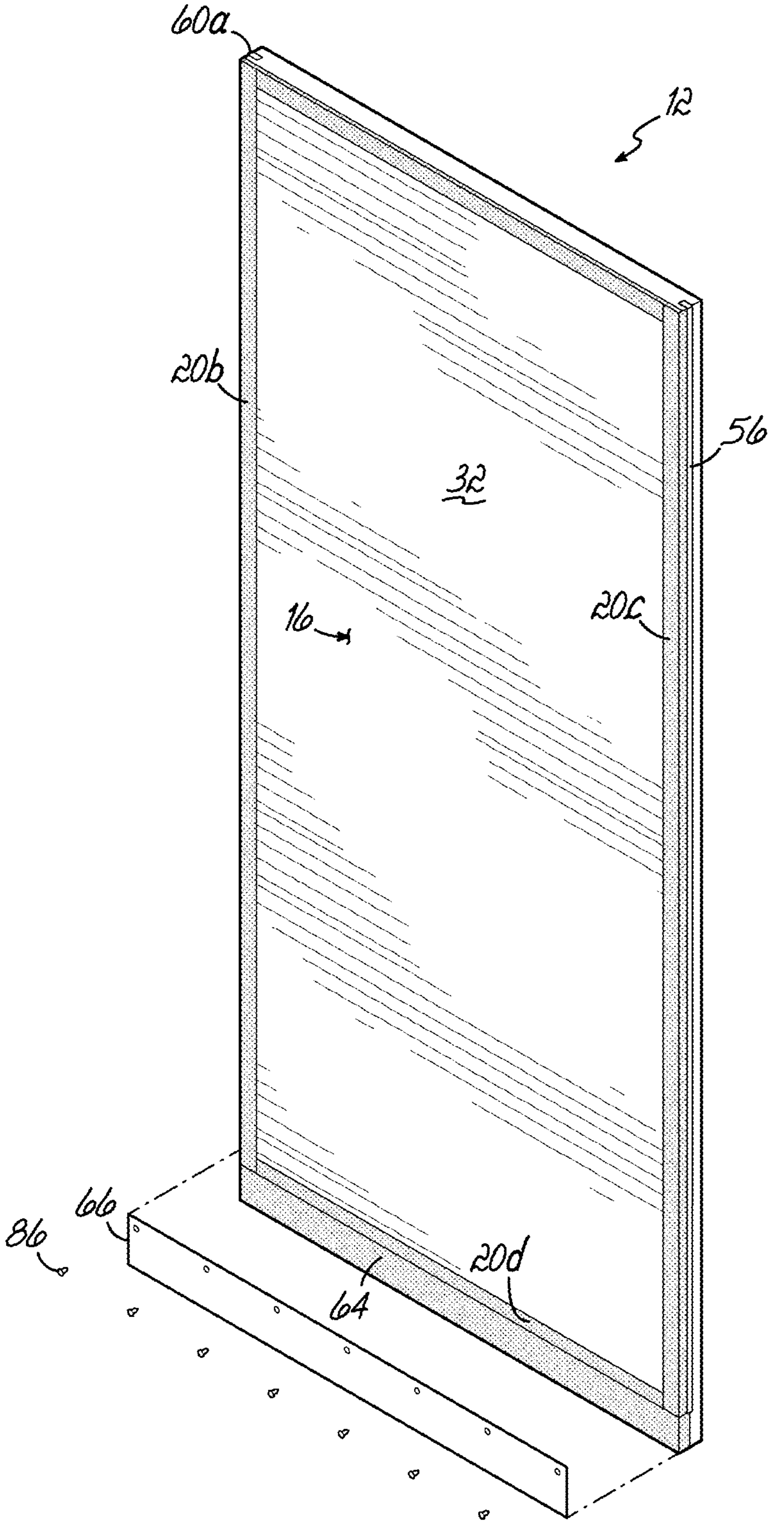
FIG. 6 is a partially assembled perspective view of the interior side of the door, where the first RF shielding material is disposed along a peripheral edge region of the body portion and where a cover piece is shown as disassembled from a bottom of the panel portion.
Figure 7:
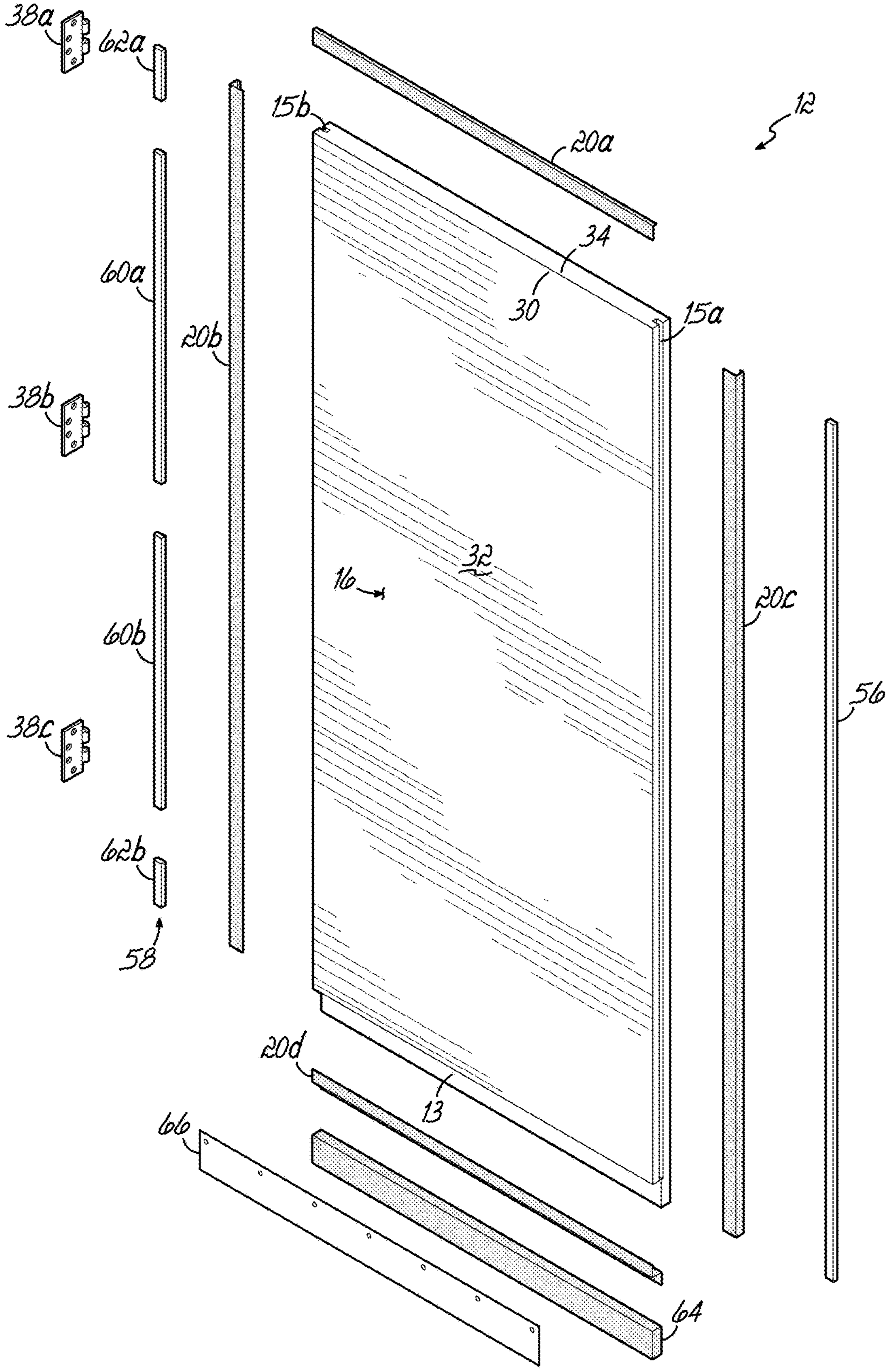
FIG. 7 shows an exploded perspective view of the exterior side of the door, including the body portion, the first RF shielding material, and the panel portion.

In some embodiments, as shown in FIGS. 5-7, the panel portion may include one or more peripheral sealing components. For example, the panel portion may include an edge seal 56 and an edge seal assembly 58. The edge seal 56 may be an elongated sealing component configured to provide a compressible interface between the body portion 16 and adjoining components of the frame 14. In some embodiments, the edge seal 56 may be formed from a compressible material such as an elastomer, rubber, silicone, foam, or composite sealing material, optionally including a conductive or RF-compatible outer layer, to accommodate tolerance variations and maintain consistent sealing contact along the lateral edge of the door 12. In some embodiments, as shown, the edge seal 56 may be formed as a continuous strip. In other embodiments, the edge seal 56 may be formed as multiple aligned segments. FIG. 6 shows the edge seal 56 as attached to the body portion 16 along a lateral edge of the door 12. FIG. 7 shows the edge seal 56 as disassembled from the body portion 16 of the door 12. As can be seen in FIG. 7, a lateral edge of the body portion 16 may contain a cavity 15*a*. The edge seal 56 may be attached to the body portion 16 by being positioned within the cavity 15*a*, as is shown in FIG. 6.

In some embodiments, as is shown in FIG. 5, the edge seal assembly 58 includes inner edge seal members 60*a*, 60*b* and outer edge seal members 62*a*, 62*b*. The inner edge seal members 60*a*, 60*b* and outer edge seal members 62*a*, 62*b* may be elongated members configured to provide a compressible interface between the body portion 16 and adjoining components of the frame 14. In a preferred embodiment, the inner edge seal members 60*a*, 60*b* and outer edge seal members 62*a*, 62*b* may be formed from an acoustic sealing material, such as rubber or neoprene, optionally including foam-core or layered elastomeric constructions, to reduce airborne sound leakage at the hinge-side edge and to satisfy one or more sound transmission class (STC) requirements when the door 12 is in the closed position. In some embodiments, the edge seal assembly 58 may additionally be configured to cooperate with adjacent RF-shielding features (e.g., by limiting gap-related leakage paths or by including an optional conductive layer or coating), while maintaining the acoustic sealing functionality described herein. In some embodiments, a different number of seal members be used, depending on the number of hinge slots and hinge assembles being implemented as part of the door 12.

The edge seal assembly 58 may extend longitudinally along the door 12, generally parallel to the height 17 of the door 12. FIG. 4 shows the edge seal assembly 58 as attached to the body portion 16 along the lateral edge of the door 12 that opposes the lateral edge of the edge seal 56. FIG. 5 shows the edge seal assembly 58 as disassembled from the body portion 16 of the door 12. As can be seen in FIG. 5, the lateral edge of the door 12 that opposes the lateral edge of edge seal 56 may contain a cavity 15*b*. Respective components of the edge seal assembly 58 may be attached to the body portion 16 by being positioned within the cavity 15*b*, as is shown in FIG. 4.

Together, the inner edge seal members 60*a*, 60*b* and the outer edge seal members 62*a*, 62*b* form a layered edge structure that defines the geometry, thickness, and edge profile of the panel portion along the corresponding side of the door 12. The edge seal 56 and the edge seal assembly 58 together define opposing edge regions of the panel portion and establish the lateral boundary structure of the door 12. These components represent the lateral sealing structures of the door 12 and contact surfaces configured to engage corresponding RF-shielding materials of the frame 14 when the door 12 is in the closed position.

In some embodiments, the door 12 includes the first RF shielding material. For example, and as shown in FIGS. 5-7, the first RF shielding material may include one or more discrete pieces, such as pieces 20*a*, 20*b*, 20*c*, and/or 20*d*. These discrete pieces are hereafter collectively referred to as the first RF shielding material 20.

FIGS. 5 and 7 show the first RF shielding material 20 in a disassembled view and FIG. 6 shows the first RF shielding material 20 applied along peripheral edge region 30 of the interior side 32 of the door 12. In other embodiments, the first RF shielding material 20 may be one continuous piece (e.g., rather than overlapping or connecting discrete pieces).

In some embodiments, the first RF shielding material 20 may include a conductive RF shielding medium applied along the interior side 32 of the door 12. For example, and as is shown in FIG. 6, the first RF shielding material 20 may be applied along peripheral edge region 30 of the interior side 32 of the door 12. In this case, the first RF shielding material 20*a* may be applied to a top region of the body portion 16, the first RF shielding material 20*b* and first RF shielding material 20*c* may be applied to opposing sides of the interior side of the body portion 16, and the first RF shielding material 20*d* may be applied to a bottom region of the body portion 16. In this way, each respective first RF shielding material 20*a*, 20*b*, 20*c*, 20*d* may overlap at a corner region. In a preferred embodiment, the first RF shielding material 20 may have a nominal thickness of approximately one inch along the peripheral edge region 30. In other embodiments, the first RF shielding material 20 may have other thicknesses, such as approximately one-half inch, one and one-half inches, or other suitable dimensions.

In some embodiments, the first RF shielding material 20 may further extend at least partially from the peripheral edge region 30 onto an adjacent side surface 34. For example, the first RF shielding material 20*c* may extend at least partially onto a corresponding adjacent side surface 34 and may be positioned beneath the edge seal 56 such that the edge seal 56 compresses the first RF shielding material 20 against adjoining frame-side conductive materials when the door 12 is in the closed position. In this embodiment, the first RF-shielding material 20*a*, 20*b*, 20*c*, 20*d* may include the same extensions (e.g., extending at least partially onto a corresponding adjacent side surface and positioned beneath corresponding sealing components of the door 12. In a preferred embodiment, the first RF shielding material 20 may extend onto a corresponding adjacent side surface with an overlap distance of approximately one-half inch to five-eighths of an inch, depending on sealing tolerances, compression characteristics, and RF attenuation requirements.

As will be described further herein, the placement and continuous coverage of the first RF shielding material 20 along the edges ensures conductive engagement with corresponding RF-shielding materials carried by the frame 14.

In the illustrated embodiment, the first RF shielding material 20*a*, 20*b*, and 20*c* are each formed with a generally L-shaped cross-section, defining a first leg configured to overlie or contact the interior side face 2 of the body portion 16 and a second leg configured to extend onto the adjacent side surface 34. This L-shaped geometry allows the first RF shielding material 20*a*, 20*b*, 20*c* to wrap around the peripheral edge region 30 of the door 12, thereby increasing the contact area and improving conductive engagement with corresponding frame-side RF shielding materials when the door 12 is in the closed position. Such configurations are particularly well suited for vertical and upper edge regions of the door 12 where compression by edge seals or frame members occurs primary in one direction.

By contrast, the first RF shielding material 20*d*, which is positioned along the lower peripheral edge region 30 of the door 12, is shown as having a more complex multi-flanged or Z-shaped cross-section. In this configuration, the first RF shielding material 20*d* includes a first portion disposed within a bottom cavity 13 of the door 12, an intermediate portion extending laterally beneath the threshold seal 64, and an exposed portion positioned to engage the threshold 44 of the frame 14. This Z-shaped profile enables the first RF shielding material 20*d* to establish conductive continuity across multiple planes and interfaces, including the body portion 16 of the door 12, the threshold seal 64, and the frame-side threshold 44, while remaining mechanically secured by the seal retainer 66. Furthermore, and as is described below, in some embodiments, the threshold 44 may be wrapped or coated with an RF shielding material (e.g., an RF shielding fabric described herein) so that the threshold seal 64 itself provides an RF shielding interface that is adjacent to the floor region when the door 12 is in the closed position.

More generally, the first RF shielding material 20 may be formed with L-shaped, Z-shaped, stepped, flanged, folded, bent, or multi-planar cross-section, depending on the desired contact geometry, compression direction, and adjacent structural features. In other embodiments, the first RF shielding material 20 may be formed with curved, U-shaped, T-shaped, or irregular profiles, or may be implemented as a flat strip combined with folded edges, layered laminates, or localized thickened regions. The specific cross-sectional shape may be selected to optimize electrical continuity, mechanical retention, tolerance accommodation, and sealing performance for a given door and frame configuration.

The first RF shielding material 20 may be formed from a metallized or plated RF shielding fabric, such as a copper-nickel woven fabric, a silver-plated fabric, a nickel-plated fabric, or combinations thereof. In some embodiments, the first RF shielding material 20 may be rendered electrically conductive through a metal plating or infusion process while maintaining flexibility sufficient to conform to edge geometries of the door 12.

In a preferred embodiment, the first RF shielding material 20 may include a conductive foil or tape, such as aluminum foil tape, copper foil tape, or a conductive adhesive-backed laminate. In other embodiments, the first RF shielding material 20 may include a composite structure having an RF shielding fabric portion combined with a compressible elastomeric or foam-based backing. Example elastomeric materials may include natural rubber, silicone rubber, polyurethane, ethylene propylene rubber (EPR), neoprene, polybutadiene, or similar compressible materials that deform under pressure to maintain electrical continuity.

In one example, the first RF shielding material 20 may include a conductive fabric-over-foam RFI profile gasket configured to provide a compliant, conductive interface along the door perimeter. In another example, the first RF shielding material 20 may include a conductive fabric-over-foam gasket construction similar to those used in input/output (I/O) backplane shielding applications. In some embodiments, the first RF shielding material 20 may include a conductive RF shielding laminate. Different pieces of the first RF shielding material 20 (e.g., pieces 20*a*-20*d*) may employ different material constructions depending on location, compression requirements, and adjacent frame interfaces.

In some embodiments, the first RF shielding material 20 may be applied to respective hinge slots 36*a*, 36*b*, 36*c*. For example, the first RF shielding material 20*a*, 20*b*, 20*c* may be applied to extend at least partially into, around, and/or adjacent to respective hinge slots 36*a*, 36*b*, 36*c*. To provide a specific example, the first RF shielding material 20*a*, 20*b*, 20*c* may line or partially line interior surfaces of respective hinge slots 36*a*, 36*b*, 36*c* such that conductive material is present beneath and/or adjacent to corresponding hinge leaves when the respective hinge assemblies 38*a*, 38*b*, 38*c* are installed. As such, electrical continuity across regions of the door 12 may remain uninterrupted by hinge hardware, thereby reducing RF leakage paths adjacent to the respective hinge assemblies 38*a*, 38*b*, 38*c*.

Figure 3:
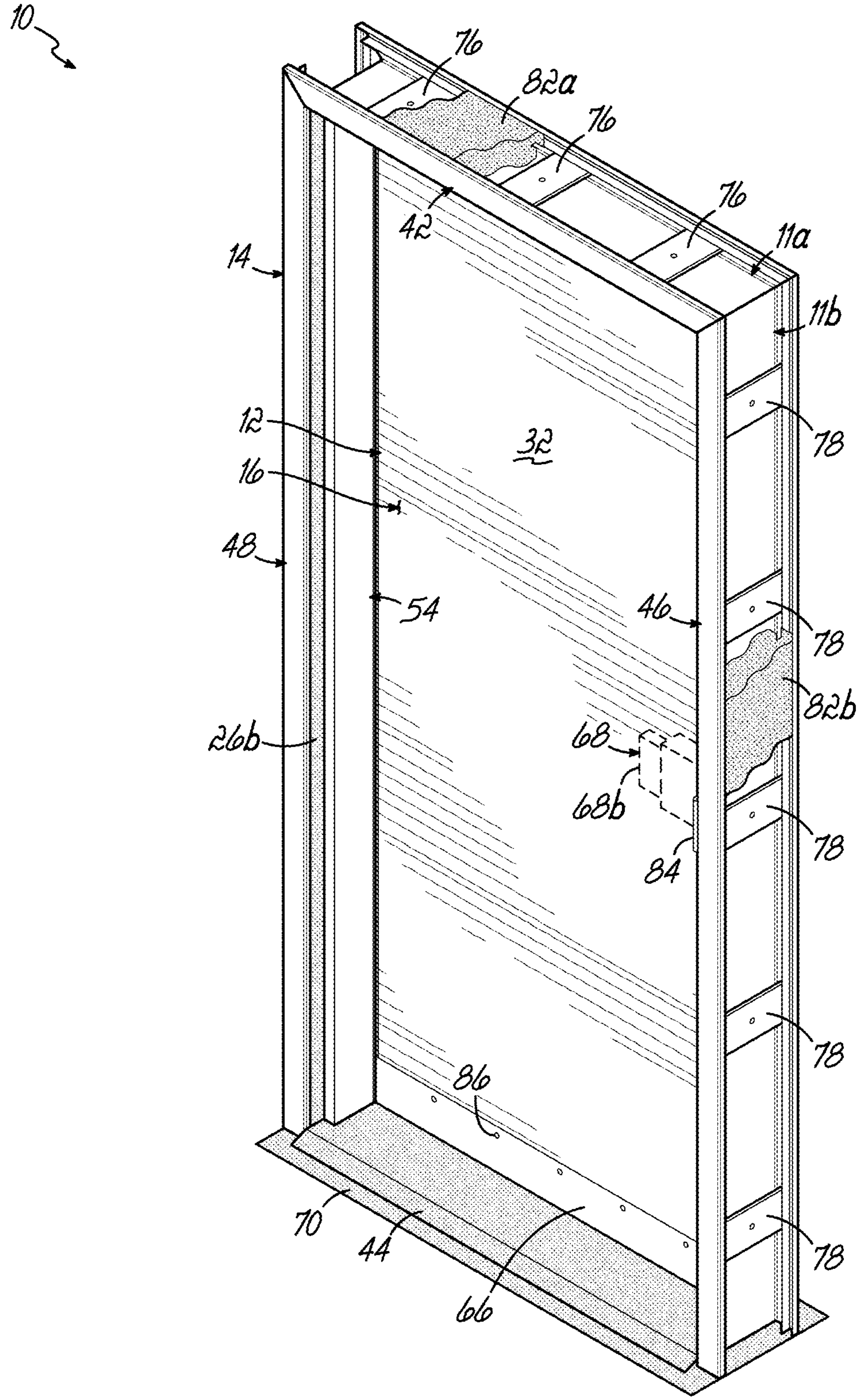
FIG. 3 shows a perspective view of an interior side of the door assembly.
Figure 8:
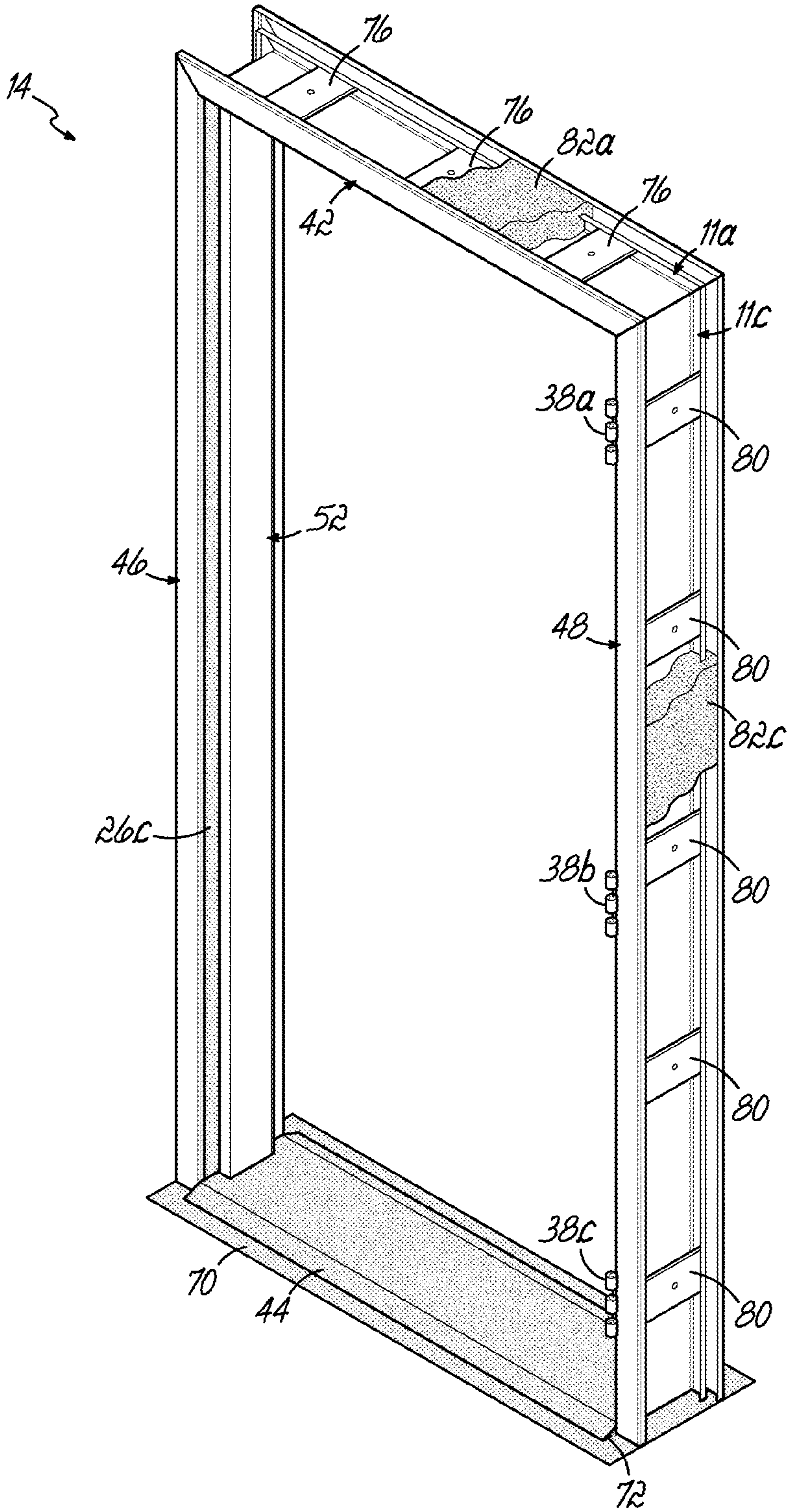
FIG. 8 shows a perspective view of the interior side of the frame of the door assembly.

In some embodiments, the bottom of the door 12 may further include a threshold seal 64 and a seal retainer 66 that cooperate to provide a sealed and RF-shielded interface between the bottom of the door 12 and a threshold of the frame 14 (see, e.g., threshold 44 in FIG. 8). The threshold seal 64 and the seal retainer 66 can be seen in FIGS. 3 and 5-7. FIG. 3 shows an assembled view of the threshold seal 64 and the seal retainer 66, where only the seal retainer 66 is visible. FIGS. 5 and 7 show a disassembled view of the threshold seal 64 and the seal retainer 66 from the exterior side 31 and interior side 32, respectively. FIG. 6 shows a partially assembled view from the interior side 32, where the seal retainer 66 is removed to illustrate the underlying embodiments.

The threshold seal 64 may be an elongated sealing element that extends laterally along the door 12, generally parallel to the length 19 of the door 12. The threshold seal 64 may be formed as a neoprene seal, an elastomeric seal, a foam-core seal, a composite seal, and/or a similar compressible sealing structure. In some embodiments, the threshold seal 64 may be positioned along the lower edge of the door 12 and may be retained in place by the seal retainer 66 that is mounted on the interior side 32 of the door 12. In some embodiments, the threshold seal 64 may be wrapped or coated with an RF shielding material so that the threshold seal 64 itself provides an RF shielding interface adjacent to the floor region when the door 12 is in the closed position.

The seal retainer 66 may be an elongated member configured to mount to the lower peripheral edge region 30 of the door 12 and to retain the threshold seal 64 in a defined position relative to the door 12. In this configuration, the seal retainer 66 may function as an adjustable door stop for the door assembly 10. For example, the seal retainer 66 may be mounted to the body portion 16 at the lower peripheral edge region 30 and may be positioned to engage a corresponding portion of the frame 14, such as the threshold 44, when the door 12 is in the closed position. Adjustment of the seal retainer 66 relative to the body portion 16 may be achieved through the use of fasteners 86 extending through elongated slots, oversized apertures, or other adjustment features formed in the seal retainer 66 and/or the body portion 16. This allows the seal retainer 66 to be selectively positioned closer to or farther from the frame 14 prior to final tightening of the fasteners 86, thereby defining a controlled stop location for the door 12. When installed, the seal retainer 66 limits further inward movement of the door 12 relative to the frame 14, establishes a closed position for the door 12, and maintains a consistent compression force on the threshold seal 64 between the door 12 and the threshold 44. This configuration supports reliable mechanical sealing, acoustic performance, and conductive engagement.

In some embodiments, the sealing arrangement of the door assembly 10 may further include a fixed stop used in combination with the seal retainer 66 to define the closed-position geometry of the door 12 relative to the frame 14. The fixed stop may be a non-movable structural feature of the frame 14 that serves as a contact surface engaged by the body portion 16 and/or the panel portion of the door 12, preventing excessive inward movement beyond the closed position. In some embodiments, the fixed stop may be covered, wrapped, or lined with an RF shielding material prior to installation of the seal retainer 66, such that the fixed stop participates in the RF-shielding pathway formed at the door-to-frame interface. The seal retainer 66 may be installed over the fixed stop to mechanically retain the threshold seal 64 and to maintain the threshold seal 64 in conductive alignment with frame-side RF shielding structures.

As can be seen in FIG. 7, a bottom cavity 13 is defined below the peripheral edge region 30 of the interior side 32 of the door 12. The bottom cavity 13 extends laterally along the door 12, generally parallel to the length 19 of the door 12. During installation, the first RF shielding material **20*d* may be positioned within the bottom cavity 13, after which the threshold seal 64 may be placed over the first RF shielding material 20*d*. As shown in FIG. 6, once assembled, the first RF shielding material 20*d* is flush with an adjacent surface of the threshold seal 64. FIG. 6 also shows that the seal retainer 66 may be positioned on top of the first RF shielding material 20*d* and the threshold seal 64 and secured using fasteners 86. In this assembled configuration, when the door 12 is in the closed position, the threshold seal 64 compresses against the threshold 44 of the frame 14, thereby forming a conductive RF-shielding interface along the bottom of the door assembly 10 and maintaining electrical continuity between the first RF shielding material 20*d* and RF shielding materials associated with the frame 14**.

Figure 9:
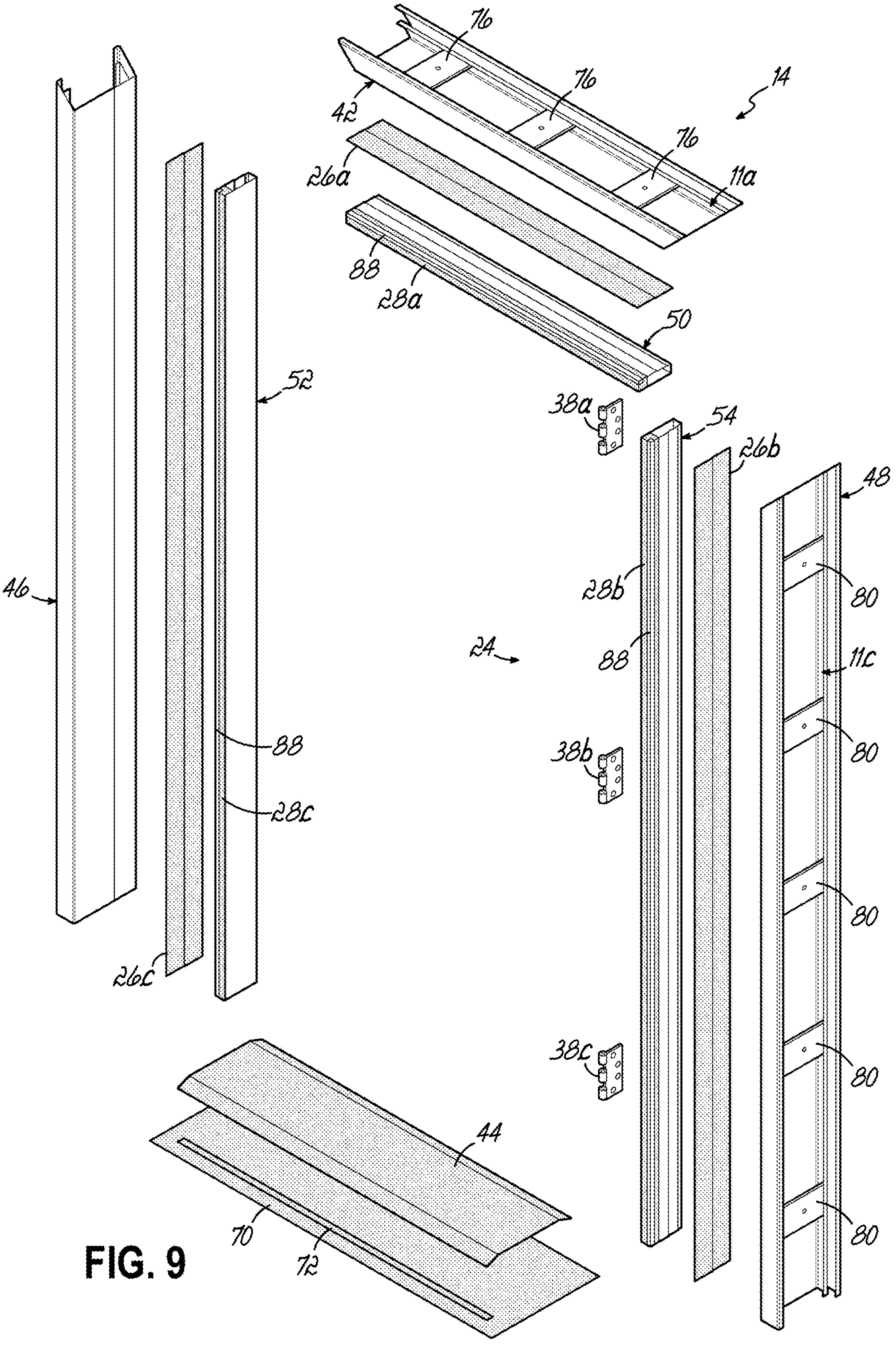
FIG. 9 shows an exploded perspective view of the interior side of the frame, where the frame includes a cover portion, a second RF shielding material, and a jamb portion that includes a third RF shielding material.
Figure 10:
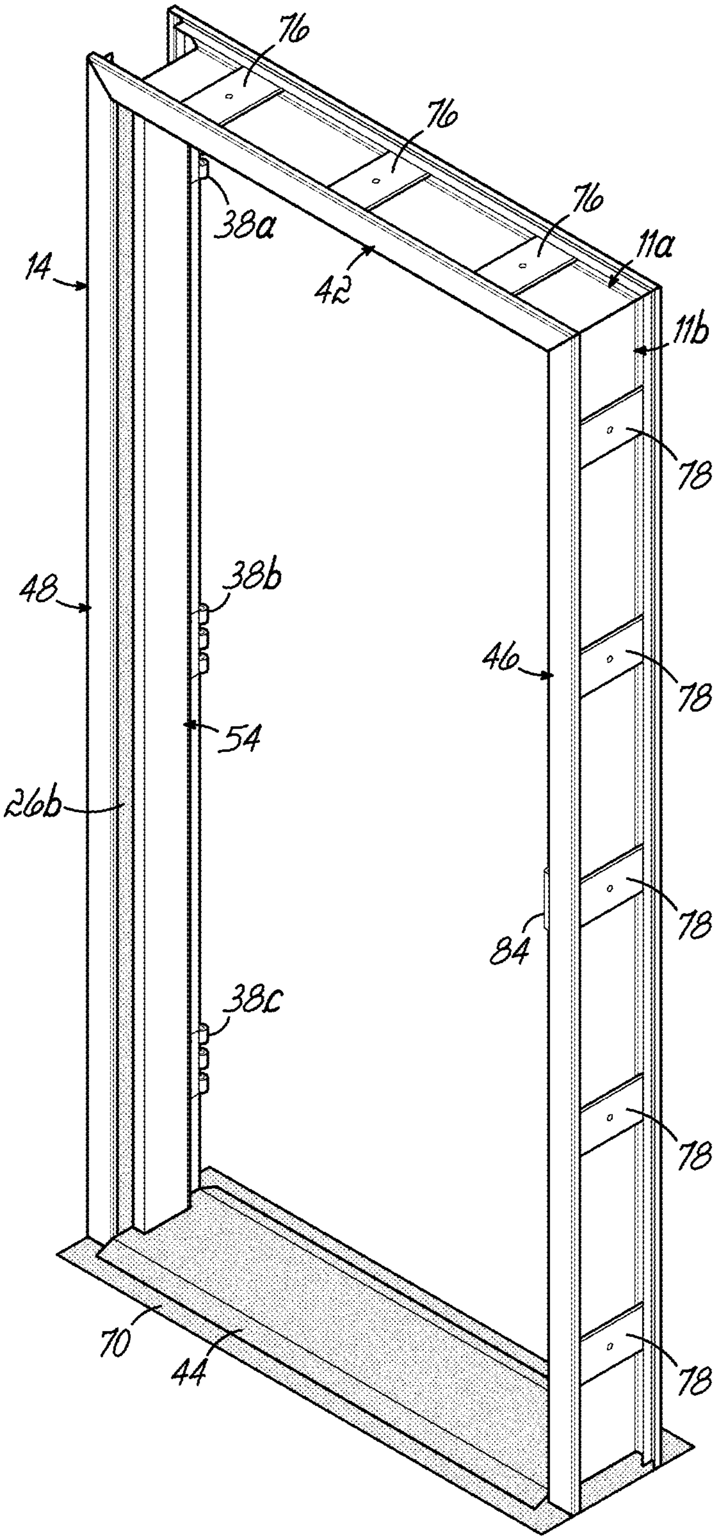
FIG. 10 shows a perspective view of the exterior side of the frame.
Figure 11:
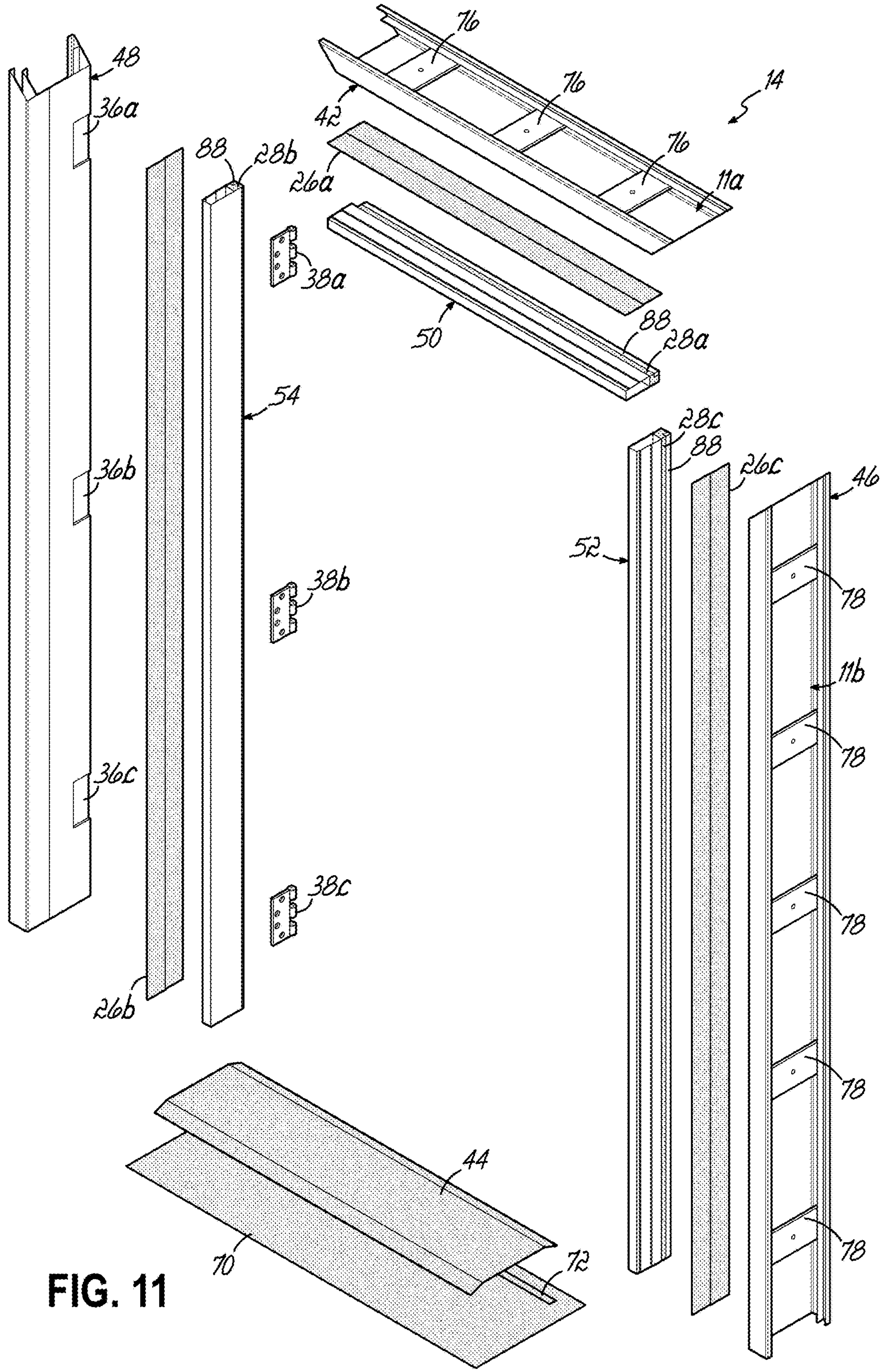
FIG. 11 shows an exploded perspective view of the exterior side of the frame.
Figure 12:
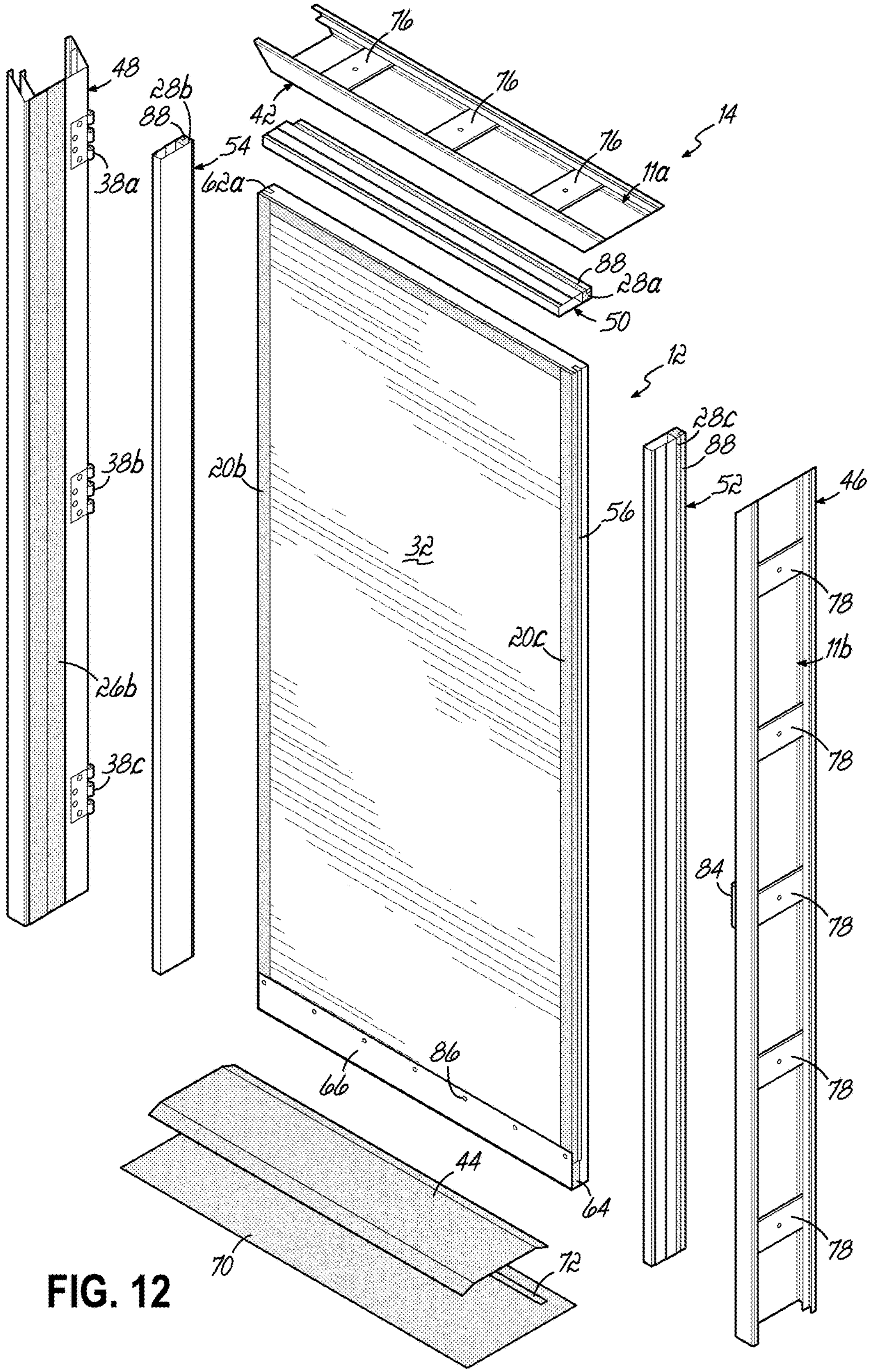
FIG. 12 shows a partially assembled, partially exploded perspective view of the door and the frame, where the first RF shielding material is attached to the body portion of the door and the second RF shielding material is attached to the cover portion of the frame.

FIG. 8 shows a perspective view of the interior side of the frame 14 of the door assembly 10. FIG. 9 shows an exploded perspective view of the interior side of the frame 14, where the frame 14 includes a cover portion, a second RF shielding material, and/or a third RF shielding material disposed within the jamb portion. The second RF shielding material is shown as discrete pieces **26*a*, 26*b*, 26*c* and is hereafter collectively referred to as the second RF shielding material 26. The third RF shielding material is shown as discrete pieces 28*a*, 28*b*, 28*c*, and is hereafter collectively referred to as the third RF shielding material 28. FIG. 10 shows a perspective view of the exterior side of the frame 14. FIG. 11 shows an exploded perspective view of the exterior side of the frame 14. FIG. 12 shows a partially assembled view of the door assembly 10, where the first RF shielding material 20 is attached to the body portion 16 of the door 12 and the second RF shielding material 26 is attached to the cover portion of the frame 14**.

In some embodiments, the cover portion may include a set of interconnected structural members that establish an outward-facing perimeter of the frame 14. For example, as shown in FIG. 9, the cover portion may include a cover head piece 42 and opposing cover side pieces 46, 48. The cover head piece 42 may be an elongated structural member positioned along an upper portion of the frame 14 and extending laterally in a direction generally parallel with a length 19 of the door 12. The opposing cover side pieces 46, 48 may be elongated structural members positioned along opposing sides of the frame 14 and extending longitudinally in a direction generally parallel to the height 17 of the door 12. Pieces of the cover portion may conceal underlying frame elements and support RF-shielding materials and/or other sealing structures. Further, pieces of the cover portion may be secured by fasteners or interlocking flanges to enable removal or replacement while maintaining electrical continuity across adjoining portions of the frame 14.

In some embodiments, each respective cover piece may be a discrete component joined together during installation. In some embodiments, the cover portion may be formed as a single, integral component that spans multiple sides of the frame 14.

The cover portion may serve as a mounting substrate for the second RF shielding material 26. For example, the second RF shielding material **26*a* may be attached to a bottom side of the cover head portion 42, the second RF shielding material 26*b* may be attached to a bottom of the cover side piece 48 (e.g., as is shown in FIG. 12), and the second RF shielding material 26*c* may be attached to a bottom of the cover side piece 46. That is to say, each discrete piece of the second RF shielding material 26 may be positioned between a corresponding part of the cover portion and the jamb portion and may provide a continuous conductive shielding layer extending along one or more sides of the frame 14. Further, the second RF shielding material 26 may be conductively coupled, directly or indirectly, to other RF shielding materials of the door assembly 10 when the door 12 is in the closed position. For example, in the illustrated embodiments, the second RF shielding material 26 is conductively coupled to the third RF shielding material 28 disposed within the jamb portion and the third RF shielding material 28 is positioned to engage the first RF shielding material 20 carried by the door 12**, thereby establishing a continuous RF-shielding pathway.

In a preferred embodiment, the second RF shielding material 26 may have a nominal thickness of approximately four inches. In other embodiments, the second RF shielding material 28 may have other suitable thicknesses.

The jamb portion may include one or more elongated members that define the opening of the frame 14 that receives the door 12. In some embodiments, as is shown in FIGS. 9 and 11, the jamb portion may include a jamb head piece 50 and opposing jamb side pieces 52, 54. The jamb side pieces 52, 54 extend longitudinally in a direction generally parallel to the height 17 of the door 12. The jamb head piece 50 extends laterally in a direction generally parallel to the length 19 of the door 12. These jamb components provide internal support for sealing systems, threshold components, hinges, and RF shielding materials. Fasteners or brackets may be used to secure the jamb portion of the frame 14 to the surrounding wall structure 40.

In some embodiments, the jamb portion may further include the third RF shielding material 28. For example, the third RF shielding material 28 may include discrete pieces **28*a*, 28*b*, 28*c* that are each inserted into or mounted against a respective channel of a corresponding piece of the jamb portion. Specifically, the third RF shielding material 28***a* may be disposed along a channel or an inward-facing surface of the jamb head piece 50, the third RF shielding material 28*b* may be disposed along a channel or an inward-facing surface of jamb side piece 54, and the third RF shielding material 28*c* may be disposed along a channel or an inward-facing surface of the jamb side piece 52. The third RF shielding material 28 may include compressible, elastomer-backed RF shielding elements, RF fabric wrapped seal structures, and/or other conductive materials configured to establish a conductive engagement point with the first RF shielding material 20 carried by the door 12 when the door 12 is in the closed position. In some embodiments, the third RF shielding material 28 may be conductively coupled, directly or indirectly, to at least a portion of the second RF shielding material 26 so that the frame-side shielding forms a continuous RF-shielding pathway.

In some embodiments, as shown in FIGS. 3, 8, and 9, the frame 14 may further include a threshold 44 positioned along a lower portion of the jamb portion. The threshold 44 may extend laterally across a bottom of an opening of the door 12 and may serve as a structural sill and an RF-shielding interface for the bottom edge of the door 12. The threshold 44 may be considered as part of the cover portion, jamb portion, or as a separate frame subcomponent that is conductively coupled to one or both of the cover portion and the jamb portion. In the illustrated embodiments, the threshold 44 is depicted as a continuous metallic component and may itself be formed from a conductive material, such as steel, aluminum, or another metal, such that the threshold 44 functions as an RF-shielding element without requiring a separate applied RF shielding layer. In other embodiments, one or more RF shielding materials may be applied to, bonded to, or positioned beneath the threshold 44, such that the threshold 44 is conductively coupled to the second RF shielding material 26 and/or to other RF shielding components of the frame 14.

In some embodiments, the threshold 44 may be an elongated metallic sill having a width of approximately six inches and a height of approximately one-half inch. In a preferred embodiment, the threshold 44 may be constructed from stainless steel, such as an approximately 11-gauge stainless steel material. In other embodiments, the threshold 44 may have different widths, heights, thicknesses, or lengths, including thresholds sized to span door openings of approximately 36 inches, 48 inches, or other suitable dimensions. The specific dimensions of the threshold 44 may be selected based on structural, sealing, and RF-shielding requirements of a particular installation.

As further shown in FIG. 9, the threshold 44 may be positioned over or adjacent to a floor foil 70 or other conductive material that includes conductive material 72. The floor foil 70 or other conductive material may extend beneath the threshold 44 and may further extend across a portion of a floor 74 on the interior side 32 of the door assembly 10 (e.g., within an RF-shielded room or enclosure). In some embodiments, as shown, the conductive material 72 may be provided only on the interior side 32 and may be omitted on an exterior side of the threshold 44. In this configuration, the threshold 44 may be conductively coupled to the floor foil 70 or other conductive material, either through direct contact, overlapping engagement, fasteners, or an intervening conductive layer, such that electrical continuity is maintained between the frame-side RF shielding materials and the floor-mounted RF shielding materials. This conductive coupling helps preserve a substantially continuous RF-shielding boundary across the floor region of the door assembly 10 when the door 12 is installed and in the closed position.

Together, the threshold 44, the floor foil 70 or other conductive material, the second RF shielding material 26, and the third RF shielding material 28 cooperate with the first RF shielding material 20 of the door 12 to complete a conductive RF-shielding envelope along the lower perimeter of the opening of the door 12, thereby reducing or eliminating RF leakage.

In some embodiments, a fourth RF shielding material may be applied to respective sides of the frame 14. For example, cavities 11*a*, 11*b*, 11*c* within the cover portion of the frame 14 may be filled with a fourth RF shielding material 82*a*, 82*b*, 82*c*. To provide a specific example, and as shown in FIGS. 2, 3, and 8, a cavity 11*a* within the cover head piece 42 may be filled using a fourth RF shielding material 82*a* so as to cover or engulf the mounting plates 76. Similarly, as shown in FIG. 3, a cavity 11*b* within the cover side piece 46 may be filled using a fourth RF shielding material 82*b* so as to cover or engulf the mounting plates 78 of the cover side piece 46. Also, as shown in FIGS. 2 and 8, a cavity 11*c* within the cover side piece 48 may be filled using a fourth RF shielding material 82*c* so as to cover or engulf the mounting plates 80 of the cover side piece 48.

The fourth RF shielding material 82*a*, 82*b*, 82*c* may include a deformable conductive or RF-participatory medium that conforms to internal geometries of the frame 14 and maintains electrical continuity despite dimensional variations and gaps between adjoining frame components. The fourth RF shielding material 82*a*, 82*b*, 82*c* may include a conductive foam, a conductive elastomer, a particulate-filled conductive compound, or a fibrous insulating material such as mineral wool. In embodiments employing mineral wool, the mineral wool may be retained within a pack frame and may be coated, impregnated, interleaved, or compressed against conductive frame components so as to participate in the RF-shielding pathway and to suppress RF leakage through internal cavities of the frame 14. The fourth RF shielding material 82*a*, 82*b*, 82*c* may be applied to the frame 14 prior to installing the frame 14 in the opening in the wall 40. The purpose of the fourth RF shielding material 82*a*, 82*b*, 82*c* is to bridge gaps between the inner shielding of the frame 14 (e.g., the third RF shielding material 28) and the surrounding RF shielding of the wall 40 and/or the floor foil 70.

Figure 13:
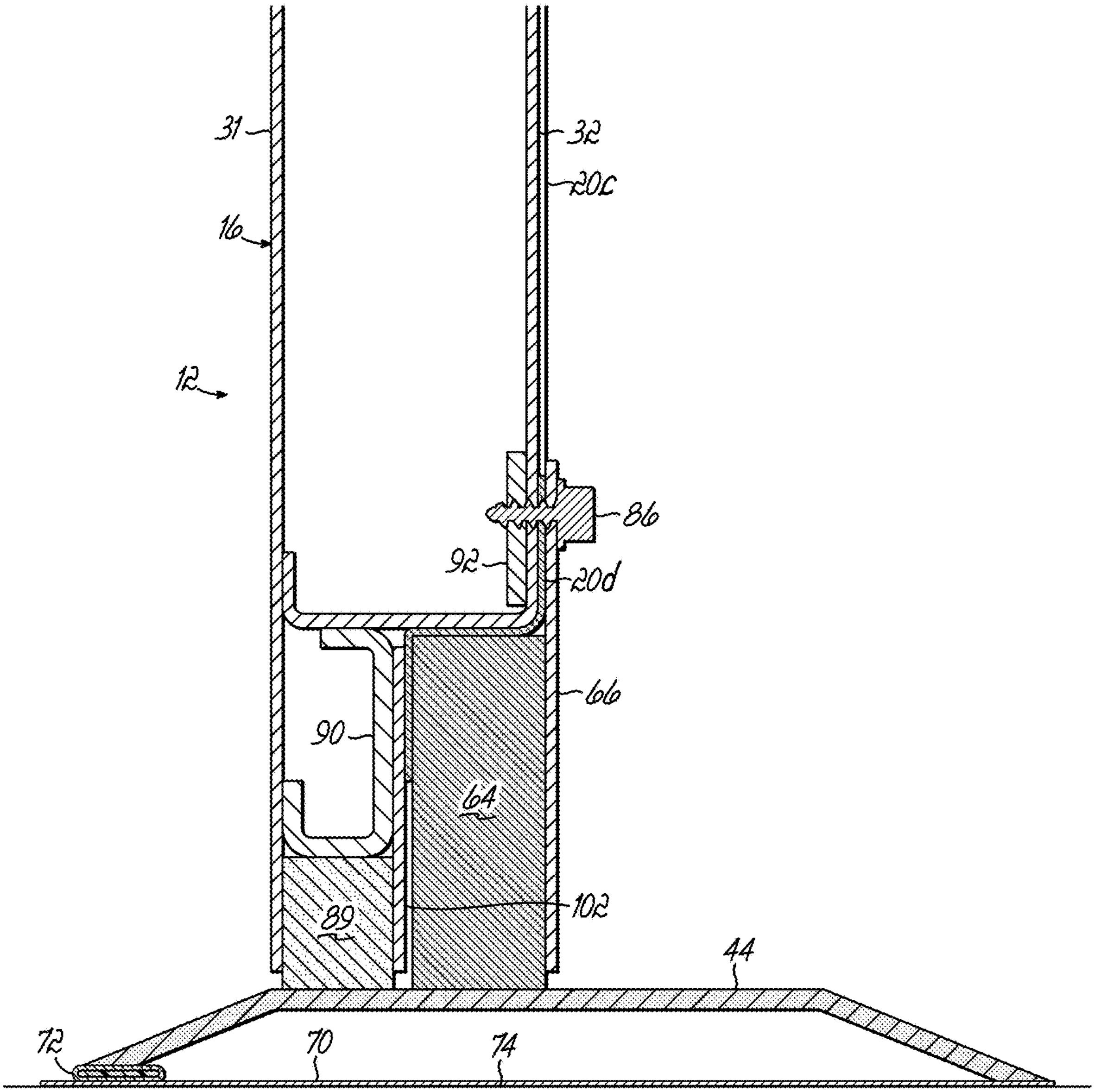
FIG. 13 shows a cross-sectional view of the door assembly taken along line 13 of FIG. 1.

FIG. 13 shows a cross-sectional view of the door assembly 10 taken along line 13 of FIG. 1. This view depicts the arrangement of conductive and structural components that cooperate to provide electrical continuity and RF shielding along the lower edge of the door assembly 10. For example, FIG. 13 shows the body portion 16 of the door 12 adjacent to frame-side structural components near the floor 74. The first RF shielding material 20*c* is shown as being disposed along the interior side 32 of the door 12.

As shown, the first RF shielding material 20*d* is disposed along the lower peripheral edge region 30 of the interior side 32 of the body portion 16 and extends into the bottom cavity 13 of the door 12. The first RF shielding material 20*d* is positioned beneath the threshold seal 64 and is held in place by the seal retainer 66. This configuration allows the first RF shielding material 20*d* to establish electrical continuity between the door-side RF shielding structures and the frame-side RF shielding structures at the floor 74.

The threshold seal 64 is shown compressed between the lower edge of the door 12 and the threshold 44 of the frame 14. The threshold seal 64 cooperates with the seal retainer 66 to maintain consistent positioning and compression, while permitting the first RF shielding material 20*d* to remain in conductive proximity to one or more other RF shielding materials of the door assembly 10. The seal retainer 66 is shown secured to the body portion 16 using a fastener, such as fastener 86, which mechanically retains the threshold seal 64 and first RF shielding material 20*d* relative to the door 12. In the embodiment shown, fastener 86 may also mechanically retain a reinforcement strip 92 that is positioned internally within the body portion 16.

FIG. 13 further illustrates the threshold 44 positioned above the floor foil 70, which includes conductive material 72 extending across the floor 74 on the interior side 32 of the door assembly 10. In some embodiments, as shown, the conductive material 72 is not present on an exterior side of the threshold 44. The threshold 44 is shown as a conductive structural component that is positioned to electrically couple the frame-side RF shielding materials to the floor-mounted RF shielding structures. In this configuration, the threshold 44, floor foil 70, and conductive material 72 cooperate to maintain electrical continuity across the floor region of the door assembly 10.

The lower edge of the door 12 further includes a drip flange 90 extending downward from the body portion 16. The drip flange 90 provides stiffness to the lower edge of the door 12 and defines a cavity that includes bottom door felt 89. The bottom door felt 89 serves as an acoustic and particulate seal when the door 12 is closed against the frame 14.

In some embodiments, a conductive backing plate 102 may be positioned between the door felt 89 and the threshold seal 64. The conductive backing plate 102 may provide a metallic substrate that supports the threshold seal 64 and/or the first RF shielding material 20*d* and ensures continuous electrical conductivity through the seal retainer 66 and into the metallic components of the door 12. The conductive backing plate 102 may be mechanically fixed to the threshold seal 64 and electrically coupled thereto to extend the RF-shielding path toward the base of the frame 14.

The configuration shown in FIG. 13 demonstrates how the lower edge of the door 12 and the corresponding frame components cooperatively form a mechanically sealed and electrically continuous interface. The first RF shielding material 20*d*, the conductive backing plate 102, and the metallic thresholds 44 and seal 64 ensure that the RF-shielding path extends uninterrupted from the door 12 through the threshold region and into the floor 74, thereby maintaining electromagnetic attenuation across the entire periphery of the door assembly 10.

Figure 14:
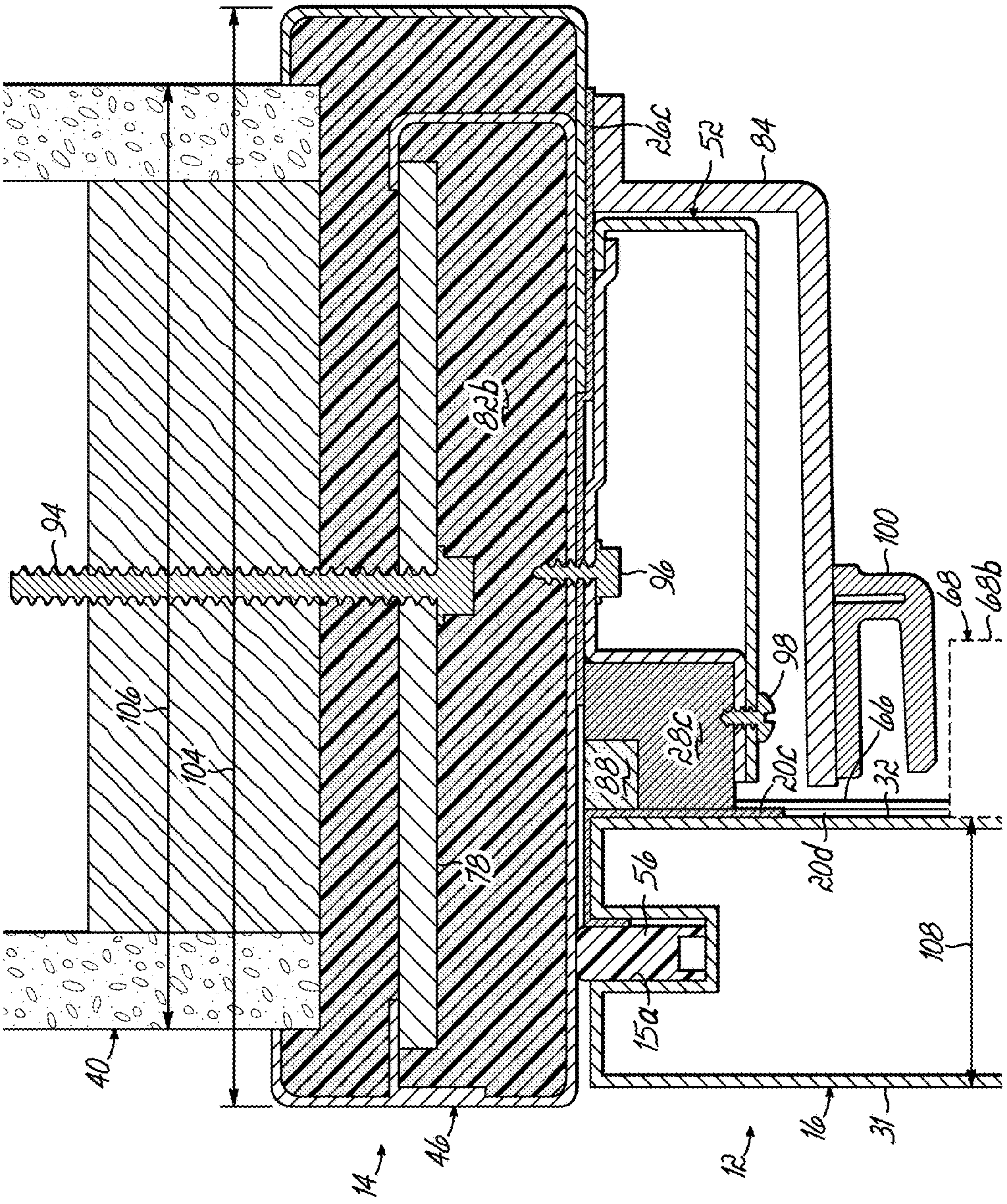
FIG. 14 shows a cross-sectional view of the door assembly taken along line 14 of FIG. 1.

FIG. 14 shows a cross-sectional view of the door assembly 10 taken along line 14 of FIG. 1. This view illustrates internal structural and conductive features of the frame 14 that cooperate to maintain electrical continuity between the frame-side RF shielding materials and the surrounding wall structure 40.

As shown in FIG. 14, the frame 14 includes the cover side piece 46 of the cover portion positioned outward of the jamb side piece 52 of the jamb portion and mounted relative to the wall structure 40 using fasteners 94 and 96. A mounting plate 78 may be part of, or may be positioned within, the cover side piece 46 and may be secured by fastener 94. The mounting plate 78 may provide a rigid internal support member and may establish a conductive interface within the cover side piece 46.

FIG. 14 further shows the fourth RF shielding material 82*b* may be disposed within the interior cavity 11*b* of the cover side piece 46. That is to say, the fourth RF shielding material 82*b* may occupy the space (e.g., interior cavity 11*b*) between adjacent conductive components of the frame 14 and is positioned to electrically couple the mounting plate 78, the cover side piece 46, and the second RF shielding material 26*c*. While only one mounting plate 78 is shown in FIG. 14, the same relative configuration may be applied to each mounting plate 78 positioned along the cover side piece 46. Further, the fourth RF shielding material 82*b* may provide an electrical bridge across internal gaps or discontinuities, thereby ensuring that electrical continuity is maintained between the side cover piece 46 and the second RF shielding material 26*c*. The second RF shielding material 26*c* is shown extending laterally within the frame 14 and positioned between the side cover piece 46 and the jamb side piece 52. In this configuration, FIG. 14 illustrates a frame-side RF-shielding pathway in which the internal mounting hardware, the fourth RF shielding material 82*b*, and the second RF shielding material 26*c* cooperate to preserve a continuous RF-shielding structure within an interior side region of the frame 14.

While not shown using a cross-sectional view, the same configuration may be utilized on the opposing side of the door assembly 10. For example, and now referring to FIG. 9, the cover side piece 48 of the cover portion is positioned outward of the jamb side piece 54 of the jamb portion and may be mounted relative to the wall structure 40 using fasteners. A mounting plate 80 may be part of, or may be positioned within, the cover side piece 48 and may be secured by fasteners. The mounting plate 80 may provide a rigid internal support member and may establish a conductive interface within the cover side piece 48.

Similarly, and referring now to FIG. 2, the fourth RF shielding material 82*c* may be disposed within the interior cavity 11*c* of the cover side piece 48. The fourth RF shielding material 82*c* may occupy the space (e.g., interior cavity 11*c*) between adjacent conductive components of the frame 14 and may be positioned to electrically couple the mounting plate 80, the cover side piece 48, and the second RF shielding material 26*b*. The fourth RF shielding material 82*c* provides an electrical bridge across internal gaps or discontinuities, thereby ensuring that electrical continuity is maintained between the side cover piece 48 and the second RF shielding material 26*b*. This configuration provides a frame-side RF-shielding pathway in which internal mounting hardware, the fourth RF shielding material 82*c*, and the second RF shielding material 26*b* cooperate to preserve a continuous RF-shielding structure within an interior side region of the frame 14.

Referring again to FIG. 14, measurements 104, 106, and 108 illustrate representative depth dimensions of portions of the door assembly 10 measured generally along a width 21 of the door 12, from the interior side 32 toward the exterior side 31. In a preferred embodiment, measurement 104 may represent an overall assembled depth of a jamb region of the door assembly 10, which may be approximately seven and one-eighth inches. Measurement 106 may represent an assembled depth of an intermediate jamb region including structural frame components and adjacent RF shielding structures, which may be approximately six and one-eighth inches. Measurement 108 may represent an assembled thickness of the door 12 itself, measured between the exterior side 31 and the interior side 32, corresponding to the width 21 of the door 12 (see, e.g., width 21 in FIG. 5). In a preferred embodiment, the assembled thickness of the door 12 may be approximately one and three-quarters inches. These dimensions are illustrative only, and other assembled depths may be used to accommodate different door constructions, RF shielding requirements, sealing tolerances, or installation environments.

Figure 15:
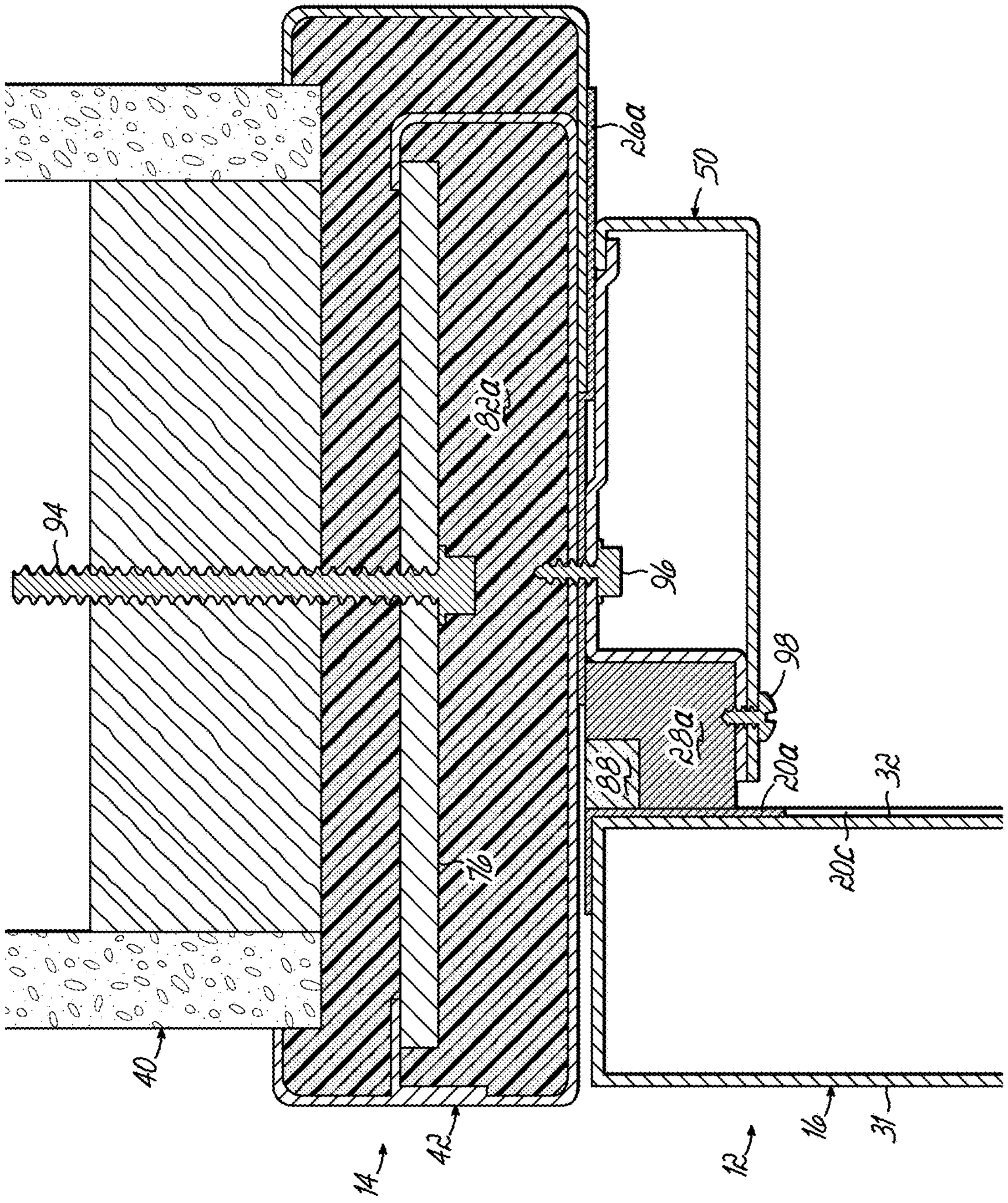
FIG. 15 shows a cross-sectional view of the door assembly taken along line 15 of FIG. 1.

FIG. 15 shows a cross-sectional view of an upper portion of the door assembly 10 taken along line 15 of FIG. 1. For example, FIG. 15 shows the fourth RF shielding material 82*a* disposed within the cover head piece 42 of cover portion. The fourth RF shielding material 82*a* may be positioned above and in conductive proximity to the second RF shielding material 26*a* and may be configured to electrically couple the mounting plate 76, the head piece 42, and the second RF shielding material 26*a*.

Collectively, FIGS. 13-15 illustrate cross-sectional views of door-side and frame-side RF-continuity arrangements in which threshold components, mounting hardware, fourth RF shielding materials 82*a*-82*c*, and the first, second, and third RF shielding materials cooperate to maintain a substantially continuous RF-shielding pathway across the boundaries of the door assembly 10 when the door 12 is in the closed position.

In some embodiments, one or more RF shielding materials may be applied to the door assembly 10. For example, the first RF shielding material 20 may be applied to the peripheral edge region 30 of the interior side 32 of the body portion 16 of the door 12. Additionally, or alternatively, RF shielding materials, such as the second RF shielding material 26 and the third RF shielding material 28, may be applied to the frame 14 itself (e.g., in the manner disclosed herein). Additionally, or alternatively, RF shielding material may be applied to one or more seals (e.g., threshold seal 64, threshold 44, etc.). Additionally, or alternatively, the fourth RF shielding material 82*a*, 82*b*, 82*c* may be applied within respective cavities 11*a*, 11*b*, 11*c* of the cover portion of the frame 14 (cover head piece 42, cover side pieces 46, 48). Additionally, or alternatively, the first RF shielding material 20 may be applied to one or more hinge slots (e.g., hinge slots 36*a*, 36*b*, 36*c*).

In some embodiments, RF shielding materials applied to the frame 14 may further include shielding elements positioned on intermediate frame members, such as mullions and/or astragals, when the door assembly 10 includes multiple door leaves. A mullion may be positioned within the opening defined by the frame 14 and extend generally between a head region and a threshold region of the frame 14, thereby separating adjacent door leaves. In other embodiments, an astragal may be mounted to a meeting edge of one door leaf (e.g., a vertical edge that faces the adjacent door leaf in the closed position) and positioned to overlap or cover a gap between adjacent door leaves when the doors are in closed positions. In such embodiments, the third RF shielding material 28 may be applied to one or more inward-facing surfaces of the mullion and/or astragal, such as opposing side surfaces configured to engage the first RF shielding material 20 carried by adjacent door leaves when the doors are in closed positions. Additionally, or alternatively, RF shielding material may be applied to an upper surface of the mullion and/or astragal adjacent the head jamb piece 50 and/or to a lower surface of the mullion adjacent the threshold 44 or floor-side RF shielding materials, such that the mullion participates in a continuous RF-shielding pathway extending between the head, side, and bottom regions of the frame 14. In embodiments employing removable mullions and/or removable astragals, the RF shielding materials may be configured to establish repeatable electrical continuity when the mullion is installed, while permitting removal of the mullion to allow passage of oversized equipment or materials through the opening defined by the frame 14.

In some embodiments, the door assembly 10 may be configured to attenuate RF energy over a broad frequency range (e.g., 10 kHz to 18 GHz) by establishing a substantially continuous conductive shielding boundary around the opening defined by the frame 14 when the door 12 is in the closed position. For example, the first RF shielding material 20 carried along the peripheral edge region 30 of the door 12 may electromechanically engage the frame-side RF shielding materials (e.g., the second RF shielding material 26 and the third RF shielding material 28), while the fourth RF shielding material 82*a*-82*c* maintains electrical continuity across internal frame cavities and between mounting hardware and adjacent conductive frame components. In such configurations, and depending on installation tolerances, compression forces, and material selections, the door assembly 10 may provide shielding effectiveness on the order of 60 dB, 80 dB, 100 dB, or other levels suitable to satisfy STCRF or other shielding requirements.

In some embodiments, the door 12 further provides acoustic insulation by including a sound-attenuating core within the body portion 16 (e.g., mineral wool, foam, mass-loaded vinyl, gypsum board, lead sheet, or multilayer composites) and by limiting perimeter leakage via compressible sealing structures (e.g., edge seal 56, edge seal assembly 58, threshold seal 64, side door felt 88, and bottom door felt 89) that are configured to be compressed when the door 12 is latched in the closed position. In such embodiments, the door assembly 10 may provide acoustic performance equivalent to an STC rating of about 50 or another suitable STC rating.

In this way, the door assembly 10 described herein provides RF shielding and acoustic insulation. Further, the door assembly 10 provides a lighter, more efficient design with easier installation. This eliminates the drawbacks associated with heavier doors, paint degradation, and maintenance issues while maintaining optimal shielding and performance characteristics. Further, proper integration of RF shielding fabric across various components of the door assembly 10, while connecting the RF shielding fabric with an RF shielding system of an enclosure to which the door assembly 10 provides access, ensures complete environmental protection. Furthermore, the door assembly 10 provides each of the above-identified benefits while satisfying all necessary STCRF requirements.

Installation of the Door Assembly 10

In some embodiments, components of the door assembly 10 may be installed in a staged sequence to ensure continuous RF shielding, proper mechanical alignment, and reliable sealing performance. Installation may begin with preparation of the frame 14 prior to mounting within the surrounding wall structure 40. For example, the second RF shielding material 26 may be applied along bottom surfaces of the cover portion of the frame 14 before the frame 14 is secured to the wall 40. Where the threshold 44 is used, frame-side RF shielding material may likewise be installed prior to installation of the threshold 44, such that the threshold 44 overlies and conductively engages the underlying RF shielding material when assembled.

Following preparation of the frame 14, door-side RF shielding components may be installed on the door 12 prior to attachment of exterior sealing and trim components. For example, the first RF shielding material 20 may be applied along the peripheral edge region 30 of the door 12 before installation of edge seals, seal retainers, or retainer covers.

In some embodiments, the first RF shielding material 20*b* may be installed prior to the mounting of outer edge seal members 62*a*, 62*b* and prior to installation of hinge assemblies 38*a*, 38*b*, 38*c*, such that the first RF shielding material 20*b* extends into hinge slots 36*a*-36*c* and beneath subsequently installed sealing components. Similarly, the first RF shielding material 20*d* may be positioned within the cavity 13 at the lower edge of the door 12 before installation of the threshold seal 64 and seal retainer 66, where the seal retainer 66 is mounted on the interior side 32 of the door 12, with the first RF shielding material 20*d* extending evenly along the length of the door slab and beneath the bottom seal components.

Next, sealing and retention components may be installed over the previously placed first RF shielding material 20*a*, 20*b*, 20*c*, 20*d*. For example, seal retainer 66 may be fastened over the first RF shielding material 20*d* at the lower edge of the door 12 so as to mechanically retain the first RF shielding material 20*d* beneath the threshold seal 64 while positioning the first RF shielding material 20*d* for conductive engagement with the threshold 44 when the door 12 is in the closed position. Similar sealing and retention components may be installed over the first RF shielding material 20*a*, 20*b*, 20*c*, in a manner consistent with that described herein. This installation sequence allows RF shielding materials to be captured, compressed, and conductively engaged by subsequently installed mechanical components, thereby forming a continuous RF-shielding path across door-side and frame-side interfaces once the door assembly 10 is fully assembled and installed.

In some embodiments, a method for installing the door assembly 10 described herein is provided. The method may, for example, be a method of forming the door assembly 10 to provide continuous RF-shielding boundary around an opening in an enclosure. The method may include providing a door 12 and a frame 14 of the door assembly 10. The method may further include applying a first RF shielding material 20 along the peripheral edge region 30 of an interior side 32 of a body portion 16 of the door 12. In some embodiments, the method may further include positioning a second RF shielding material 26 between a cover portion and a jamb portion of the frame 14. In some embodiments, the method may further include disposing a third RF shielding material 28 within the jamb portion such that the third RF shielding material 28 is conductively coupled, either directly or indirectly, to the second RF shielding material 26. The method may further include moving the door 12 into a closed position such that the first RF shielding material 20, the second RF shielding material 26, and the third RF shielding material 28 conductively engage to establish at least part of a continuous RF-shielding pathway around the opening of the enclosure.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A door assembly adapted to provide radio frequency (RF) shielding and acoustic insulation, comprising:

a door comprising a body portion and a first RF shielding material disposed along a peripheral edge region of a side of the body portion; and a frame hingedly connected to the door and defining an opening sized to receive the door, the frame comprising a cover portion and a jamb portion, wherein the frame further comprises a second RF shielding material positioned between the cover portion and the jamb portion and a third RF shielding material disposed within the jamb portion, wherein the third RF shielding material extends continuously along a jamb head piece and opposing jamb side pieces of the jamb portion of the frame, and wherein the third RF shielding material is conductively coupled to the second RF shielding material such that, when the body portion of the door is closed against the frame, the first RF shielding material, the second RF shielding material, and the third RF shielding material conductively engage and together form at least part of a continuous RF-shielding boundary around and across a periphery of the door assembly.

2. The door assembly of claim 1, wherein the frame further comprises:

a fourth RF shielding material disposed within one or more internal cavities of the cover portion of the frame.

3. The door assembly of claim 1, wherein the first RF shielding material includes a first portion disposed on the side of the body portion at the peripheral edge region and a second portion extending onto an adjacent side surface, the second portion being positioned beneath an edge seal.

4. The door assembly of claim 1, wherein the first RF shielding material extends at least partially into one or more hinge slots each respectively sized to receive a hinge assembly.

5. The door assembly of claim 1, wherein the second RF shielding material extends continuously along at least three sides of the frame to provide an unbroken conductive path under the cover portion.

6. The door assembly of claim 1, further comprising a conductive threshold disposed along a bottom portion of the frame and configured to conductively engage the first RF shielding material when the door is closed against the frame, the conductive threshold forming part of the continuous RF-shielding boundary.

7. The door assembly of claim 1, wherein the door has a core comprising one or more sound-attenuating materials selected from mineral wool, fiberglass, foam, mass-loaded vinyl, a gypsum board, a lead sheet, or a high-density particle board.

8. A door assembly adapted to provide radio frequency (RF) shielding and acoustic insulation, comprising:

a door comprising a body portion and a first RF shielding material disposed along a peripheral edge region of a side of the body portion; and a frame hingedly connected to the door and defining an opening sized to receive the door, the frame comprising a cover portion and a jamb portion, wherein the frame further comprises a second RF shielding material positioned between the cover portion and the jamb portion and a further RF shielding material disposed within one or more internal cavities of the cover portion of the frame, wherein the second RF shielding material extends continuously along at least three sides of the frame to provide an unbroken conductive path under the cover portion, wherein the further RF shielding material is conductively coupled to the cover portion and to the second RF shielding material such that, when the body portion of the door is closed against the frame, the first RF shielding material and the second RF shielding material conductively engage to define at least part of a continuous RF-shielding boundary around and across a periphery of the opening defined by the frame, and wherein the further RF shielding material electrically participates in the RF-shielding boundary.

9. The door assembly of claim 8, wherein the further RF shielding material is a fourth RF shielding material, and wherein the frame further comprises:

a third RF shielding material disposed within the jamb portion, wherein the third RF shielding material is conductively coupled to the second RF shielding material such that, when the body portion of the door is closed against the frame, the first RF shielding material, the second RF shielding material, and the third RF shielding material conductively engage and together form at least part of the continuous RF-shielding boundary around the periphery of the door assembly.

10. The door assembly of claim 9, wherein the third RF shielding material extends continuously along a jamb head piece and opposing jamb side pieces of the jamb portion of the frame.

11. The door assembly of claim 8, wherein the first RF shielding material includes a first portion disposed on the side of the body portion at the peripheral edge region and a second portion extending onto an adjacent side surface, the second portion being positioned beneath an edge seal.

12. The door assembly of claim 8, wherein the first RF shielding material extends at least partially into one or more hinge slots each respectively sized to receive a hinge assembly.

13. The door assembly of claim 8, further comprising a conductive threshold disposed along a bottom portion of the frame and configured to conductively engage the first RF shielding material when the door is closed against the frame, the conductive threshold forming part of the continuous RF-shielding boundary.

14. A door assembly adapted to provide radio frequency (RF) shielding and acoustic insulation, comprising:

a door comprising a body portion and a first RF shielding material disposed along a peripheral edge region of a side of the body portion; and a frame hingedly connected to the door and defining an opening sized to receive the door, the frame comprising a cover portion and a jamb portion, wherein the frame further comprises a second RF shielding material positioned between the cover portion and the jamb portion, a third RF shielding material disposed within the jamb portion, and a fourth RF shielding material disposed within one or more internal cavities of the cover portion of the frame, wherein the third RF shielding material is conductively coupled to the second RF shielding material such that, when the body portion of the door is closed against the frame, the first RF shielding material, the second RF shielding material, and the third RF shielding material conductively engage and together form at least part of a continuous RF-shielding boundary around and across a periphery of the door assembly, and wherein the fourth RF shielding material electrically participates in the RF-shielding boundary.

15. The door assembly of claim 14, wherein the first RF shielding material extends at least partially from the peripheral edge region of the side of the body portion to an adjacent side surface.

16. The door assembly of claim 14, wherein the first RF shielding material extends at least partially into one or more hinge slots each respectively sized to receive a hinge assembly.

17. The door assembly of claim 14, wherein the second RF shielding material extends continuously along at least three sides of the frame to provide an unbroken conductive path under the cover portion, and wherein the third RF shielding material extends continuously along a jamb head piece and opposing jamb side pieces of the jamb portion of the frame.

18. The door assembly of claim 14, further comprising a conductive threshold disposed along a bottom portion of the frame and configured to conductively engage the first RF shielding material when the door is closed against the frame, the conductive threshold forming part of the continuous RF-shielding boundary.

* * * * *